United States Patent
Yamada et al.

(10) Patent No.: US 6,906,372 B2
(45) Date of Patent: Jun. 14, 2005

(54) SEMICONDUCTOR DEVICE WITH VERTICAL TRANSISTOR FORMED IN A SILICON-ON-INSULATOR SUBSTRATE

(75) Inventors: Takashi Yamada, Ebina (JP); Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/993,967

(22) Filed: Nov. 27, 2001

(65) Prior Publication Data

US 2002/0076880 A1 Jun. 20, 2002

(30) Foreign Application Priority Data

Dec. 6, 2000 (JP) .................................. 2000-371106

(51) Int. Cl.$^7$ ..................... H01L 27/108; H01L 29/76; H01L 29/94; H01L 31/119
(52) U.S. Cl. ........................ 257/301; 257/68; 257/71; 257/296
(58) Field of Search .................... 257/68, 71, 296–313, 257/905–908; 438/296

(56) References Cited

U.S. PATENT DOCUMENTS

| | | | |
|---|---|---|---|
| 4,713,678 A | * 12/1987 | Womack et al. | 357/23.6 |
| 4,792,834 A | * 12/1988 | Uchida | 357/23.6 |
| 4,833,516 A | * 5/1989 | Hwang et al. | 357/23.6 |
| 5,055,898 A | * 10/1991 | Beilstein, Jr. et al. | 357/23.6 |
| 5,208,657 A | * 5/1993 | Chatterjee et al. | 257/302 |
| 5,316,962 A | * 5/1994 | Matsuo et al. | 437/52 |
| 5,349,218 A | * 9/1994 | Tadaki et al. | 257/296 |
| 5,502,320 A | * 3/1996 | Yamada | 257/302 |
| 5,508,541 A | * 4/1996 | Hieda et al. | 257/301 |
| 5,512,767 A | * 4/1996 | Noble, Jr. | 257/301 |
| 5,905,279 A | * 5/1999 | Nitayama et al. | 257/301 |
| 5,929,476 A | 7/1999 | Prall | |
| 5,945,704 A | * 8/1999 | Schrems et al. | 257/301 |
| 5,959,322 A | * 9/1999 | Lee | 257/298 |
| 5,998,822 A | * 12/1999 | Wada | 257/301 |
| 6,005,268 A | * 12/1999 | Parekh et al. | 257/296 |
| 6,294,423 B1 | * 9/2001 | Malik et al. | 438/241 |
| 6,426,252 B1 | * 7/2002 | Radens et al. | 438/243 |

OTHER PUBLICATIONS

T. Hamamoto et al., "well concentration: A Novel Scaling Limitation Factor derived from DRAM, Retention Time and Its Modeling" IEDM Tec. Dig., P915–918.

(Continued)

*Primary Examiner*—Mary Wilczewski
*Assistant Examiner*—Monica Lewis
(74) *Attorney, Agent, or Firm*—Pillsbury Winthrop LLP

(57) ABSTRACT

A semiconductor device has an element substrate including a semiconductor layer of a first conductivity type being formed over a semiconductor substrate with a dielectric film interposed therebetween. A groove is formed in the element substrate with a depth extending from a top surface of the semiconductor layer into the dielectric film, the groove having a width-increased groove portion in the dielectric film as to expose a bottom surface of the semiconductor layer. An impurity diffusion source is buried in the width-increased groove portion to be contacted with the bottom surface. A transistor is formed to have a first diffusion layer being formed through impurity diffusion from the impurity diffusion source to the bottom surface of the semiconductor layer, a second diffusion layer formed through impurity diffusion to the top surface of the semiconductor layer, and a gate electrode formed at a side face of the groove over the impurity diffusion source with a gate insulation film between the side face and the gate electrode.

9 Claims, 24 Drawing Sheets

OTHER PUBLICATIONS

U. Gruening, et al., IEDM Technical Digest, "A Novel Trench DRAM Cell with a VERtIcal Access Transistor and BuriEd STrap (VERI BEST) for 4Gb/16Gb", 1999, pp. 25–28.

C. J. Radens, et al., IEDM Technical Digest, "An Orthogonal 6F2 Trench–Sidewall Vertical Device Cell for 4Gb/16Gb DRAM", 2000, pp. 349–352.

Patent Abstracts of Japan, Publ. No. JP 01 158768, vol. 013, No. 429, 1989.

Patent Abstracts of Japan, Publ. No. JP 01 147860, vol. 013, No. 407, 1989.

Rupp et al., "Extending trench DRAM technology to 0.15 $\mu$m groundrule and beyond", IEDM Technical Digest, 1999, p. 33–36.

Gruening et al., "A novel trench DRAM cell with a VERtIcal access transistor and BuriEd STrap (VERI BEST) for 4Gb/16Gb", IEDM Technical Digest, 1999, p. 25–28.

"High density vertical DRAM cell", IBM Technical Disclosure Bulletin, vol. 29, No. 5, 1986, p. 2335–2340.

* cited by examiner

SEMICONDUCTOR DEVICE WITH VERTICAL TRANSISTOR FORMED IN A SILICON-ON-INSULATOR SUBSTRATE

CROSS-REFERENCE TO RELATED APPLICATIONS

This application is based on and claims the benefit of priority from prior Japanese Patent Application No. 2000-371106, filed on Dec. 6, 2000, the entire contents of which are incorporated herein by reference.

BACKGROUND OF THE INVENTION

1. Field of the Invention

This invention relates in general to semiconductor microtechnologies and, more specifically, to highly integrated semiconductor devices with dynamic random access memory (DRAM) cells each having a trench capacitor and a vertical transistor that works perpendicular to the surface of a semiconductor chip. The invention also relates to methodology for fabrication of semiconductor devices of the type stated above.

2. Description of Related Art

In recent years, DRAM devices employing memory cells each consisting essentially of a single transistor and a single capacitor, also known as "1-transistor/1-capacitor" cells, are becoming denser in integration or "bit-packing" density virtually endlessly. On-chip areas of such memory cells are made smaller once per development of a new generation of products. One basic approach to reducing cell areas is to lower the occupation areas of transistors and capacitors, which make up the cells, respectively.

With regard to cell capacitors, one major problem to be solved is how the required amount of capacitance is achieved while at the same time reducing or minimizing onchip cell areas. To this end, several structures for increasing dielectricities of capacitor insulation films and/or increasing effective or "net" capacitor areas have been developed on a per-generation basis. Regarding cell transistors, attempts have been made to microfabricate for miniaturization such transistors while allowing them to retain planar structures. The currently available microfabrication technologies are principally based on traditional scaling rules, such as employing techniques for reducing source/drain diffusion layer depths and gate insulation film thickness values and/or increasing substrate impurity concentration or density.

To further miniaturize the cell transistors for higher integration in future products, the gate insulation film thickness reduction and substrate impurity concentration enhancement will become inevitable for suppressing unwanted threshold voltage drop-down (called the "short channel" effect) along with channel length shrinkage. However, an increase in substrate impurity concentration would result in an increase in junction current leakage between a substrate and storage nodes, which in turn leads to decreases in data-retaining/holding abilities of memory cells, as suggested for example by T. Hamamoto et al., "Well concentration: A novel scaling limitation factor derived from DRAM retention time and its modeling," International Electron Devices Meeting (IEDM) Technical Digest at page 915 (1995).

Additionally, whenever an attempt is made to make gate insulation films thinner, a need is felt to lower word line voltages in order to establish the required withstanding voltage or "anti-breakdown" level of gate insulation films used. For DRAM cell transistors, in order to achieve a high retention for holding stored charges in a capacitor, these are required to offer lower on-state leakage currents than ordinary logic circuits. To do this, the transistors must be set higher in threshold voltage thereof. And, if a word-line voltage is potentially lowered while the cell transistors stay high in threshold voltages, then the amount of a signal as stored into the capacitor can decrease. This gives rise to a risk that DRAM cells degrade in operation margins.

High-density DRAM cell structures capable of avoiding these problems have been proposed until today, one of which is disclosed in U.Gruening et al., "A Novel Trench DRAM Cell with a VERtIcal Access Transistor and BuriEd STrap (VERI BEST) for 4 Gb/16 Gb," IEDM Tech. Dig., 1999. This trench DRAM cell is arranged so that a capacitor is formed at lower part of a trench defined in a substrate while forming, at an upper part of the trench, a vertically structured transistor with a trench side face as its channel.

See FIG. 37. This diagram depicts a cross-sectional structure of the DRAM cell as taught by the above-identified paper, which is taken along a bit-line direction. A substrate 1 has an underlying buried semiconductive layer of n-type conductivity used for formation of a capacitor C, and an overlying p-type semiconductor layer, in which a transistor Q is to be later formed. A trench 2 is formed in the substrate 1 so as to reach the n-type layer. The capacitor is formed at lower part of this trench 2. The capacitor C has a storage electrode, on which a buried strap 3 is formed in a way integral with the storage electrode.

The buried strap 3 is for use as a node for connection between the capacitor C and its overlying transistor Q. Simultaneously, this strap can also do double-duty as an impurity diffusion source of a diffusion layer 5 of the transistor Q. The buried strap 3 has its top surface coated with an insulative film 4 for use as a "cap" layer. A transistor Q of the vertical structure type is then formed on the trench sidewall over the cap insulation film 4. The vertical transistor Q has a source formed of a diffusion layer 6 in the upper surface of the p-type layer and a drain formed of another diffusion layer 5 as fabricated through impurity diffusion from the buried strap 3.

A word line WL is shown in FIG. 37, which is formed integrally with a gate electrode of the transistor Q. In the case of so-called folded bit line structure, a "pass" word line PassWL of a neighboring cell is disposed in close proximity to the word line WL. In this case the bit line BL is to be contacted with the diffusion layer 6 at a portion laterally adjacent to the pass-word line PassWL.

In this way, the DRAM cell of FIG. 37 is arranged so that the transistor gate electrode is embedded or buried in the substrate to overlie the prior known trench capacitor, thereby achieving formation of the intended vertical transistor by use of substantially the same methodology as that in traditional DRAM cells. With such an arrangement, it is possible to provide the required transistor channel length in a direction along the depth, irrespective of on-chip cell occupation areas. This in turn makes it possible to lessen the onchip cell areas without short-channel effects.

Unfortunately, the advantage of the above-stated DRAM cell structure does not come without accompanying a penalty—the vertical transistor Q can readily vary in channel length through effectuation of etch-back processes. This can be said because the buried strap 3's upper surface position is simply determined by etchback depths at process steps of burying polycrystalline silicon materials. The channel length irregularity can cause a problem as to undesired variation or deviation of transistor characteristics.

SUMMARY OF THE INVENTION

A semiconductor device in accordance with one aspect of the present invention has: an element substrate including a semiconductor layer of a first conductivity type being insulatively formed over a semiconductor substrate with a dielectric film interposed therebetween; said element substrate having a groove formed therein with a depth extending from a top surface of said semiconductor layer into said dielectric film, said groove being formed to have an increased width portion in said dielectric film as to expose a bottom surface of said semiconductor layer; an impurity diffusion source buried in said increased width portion of said groove to be contacted with said bottom surface of said semiconductor layer; and a transistor having a first diffusion layer of a second conductivity type being formed through impurity diffusion from said impurity diffusion source to said bottom surface of said semiconductor layer, a second diffusion layer of the second conductivity type formed through impurity diffusion to said top surface of said semiconductor layer, and a gate electrode formed at a side face of said groove over said impurity diffusion source with a gate insulation film between said side face and said gate electrode. A method of fabricating a semiconductor device in accordance with another aspect of the present invention including: forming a groove in an element substrate having a semiconductor layer of a first conductivity type as insulatively formed over a semiconductor substrate with a dielectric film interposed therebetween, the groove being penetrating the semiconductor layer; selectively etching the dielectric film exposed at the groove to form an increased width portion for permitting exposure of a bottom surface of the semiconductor layer; forming an impurity diffusion source buried in the increased width portion of the groove while letting the impurity diffusion source be in contact with only the bottom surface of the semiconductor layer; forming and burying in the groove a gate electrode along with an underlying gate insulation film; and forming in said semiconductor layer source and drain diffusion layers through impurity diffusion to a top surface and also impurity diffusion to the bottom surface by use of said impurity diffusion source.

DETAILED DESCRIPTION OF THE EMBODIMENTS

Several embodiments of this invention will now be set forth with reference to the accompanying figures.

[Embodiment 1]

Figure 1:
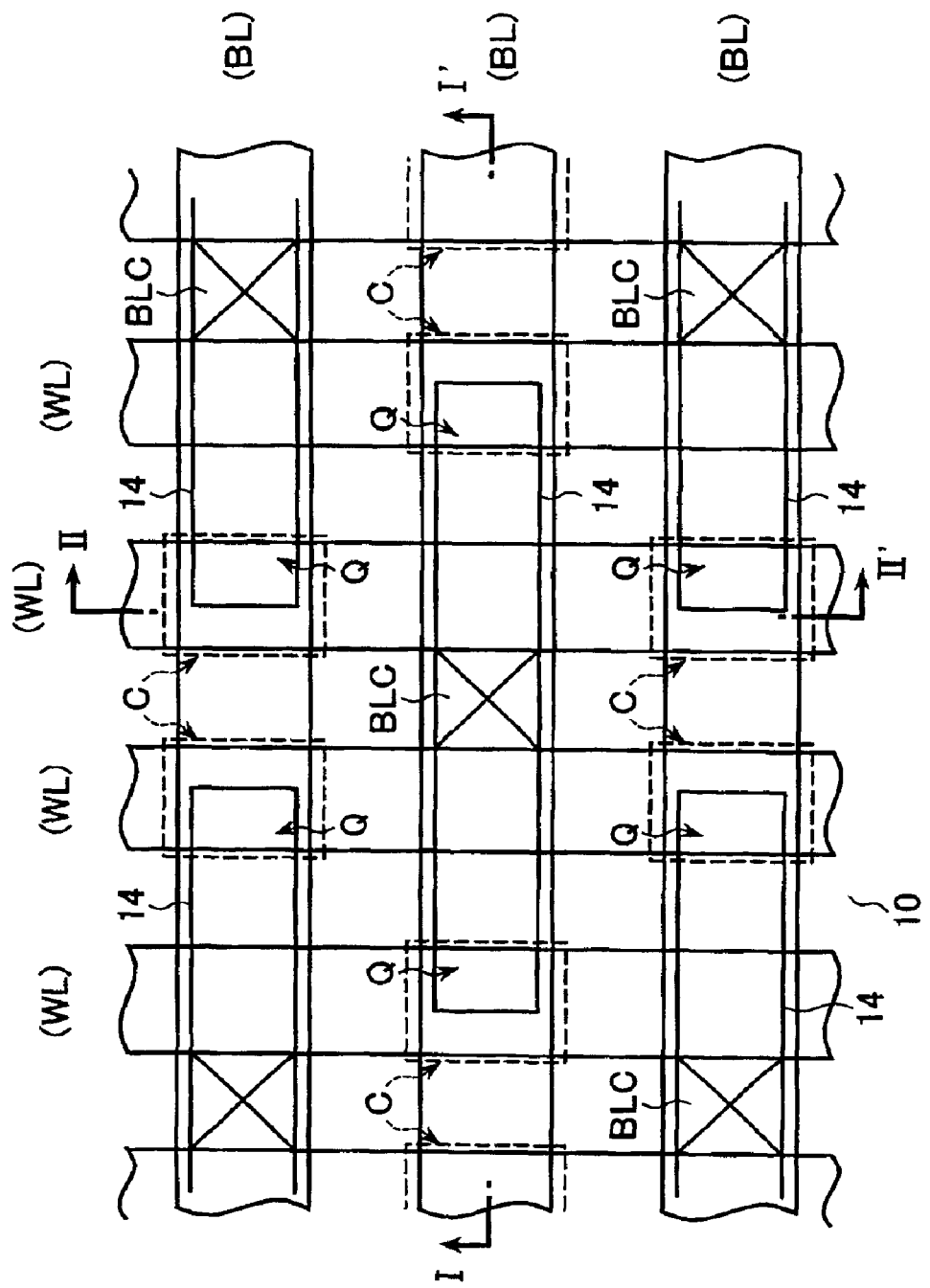
FIG. 1 is a diagram showing a plan view of main part of a DRAM cell array in accordance with an embodiment of this invention.

Referring now to FIG. 1, there is shown a plan view of a main part of a trench-capacitor-based dynamic random access memory (DRAM) cell array with half-pitch folded bit line structure in accordance with one embodiment of this invention. Also see FIGS. 2 and 3, which depict cross-sectional views of the structure of FIG. 1 as taken along lines I–I' and II–II' respectively.

The illustrative embodiment is arranged to employ a silicon-on-insulator (SOI) substrate 10 as an element substrate. This SOI substrate 10 includes a single-crystalline silicon substrate 11 of a selected conductivity type—here, n type. The n-type silicon substrate 11 has its surface on which a silicon oxide film 12 is formed, with a p-type single-crystalline silicon layer 13 formed on the silicon oxide film 12 to thereby make up the multilayer structure of SOI substrate 10. It is necessary that the silicon layer 13 has a predetermined thickness in view of the fact that this layer's thickness does define the channel length of a transistor. Currently commercially available SOI substrates are employable therefor, since these generally come with several percent of variation in silicon layer thickness. "Trench" grooves 20 are formed in this SOI substrate 10 so that each groove is deep enough to reach the inside of n-type silicon substrate 11 after penetration through the p-type silicon layer 13 and silicon oxide film 12. A trench capacitor C is formed at lower part of this groove 20 whereas a transistor Q is at upper part of groove 20.

The p-type silicon layer 13 of SOI substrate 10 is partitioned, by an element isolating dielectric film 40 as embedded or "buried" by shallow trench isolation (STI) techniques, into rectangular island-like element regions 14, each of which is for use as two neighboring cell regions. As shown in FIG. 1, capacitors C are formed and buried at end portions of each island-like element region 14. At the end portions of the element region 14, transistors Q are formed on the respective groove side faces of island regions 14 in such a manner as to at least partly overlap the respective capacitors C. It should be noted here that in practically reduced fabrication processes, the capacitors C and transistors Q are to be formed in grooves 20 prior to partitioning of the island-like element regions 14.

Figure 2:
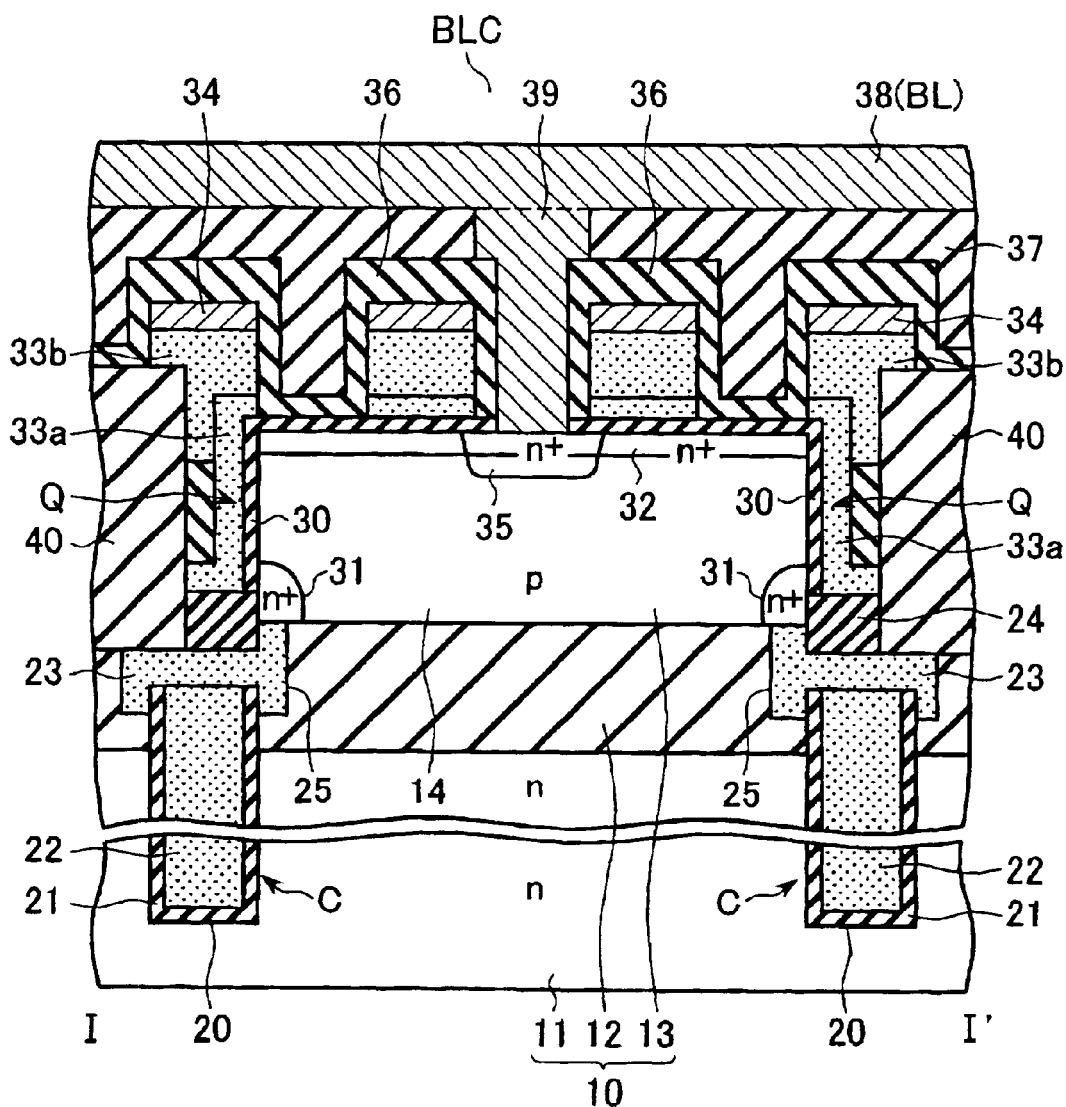
FIG. 2 illustrates, in schematic cross-section, a structure of the cell array as taken long line I–I' of FIG. 1.
Figure 3:
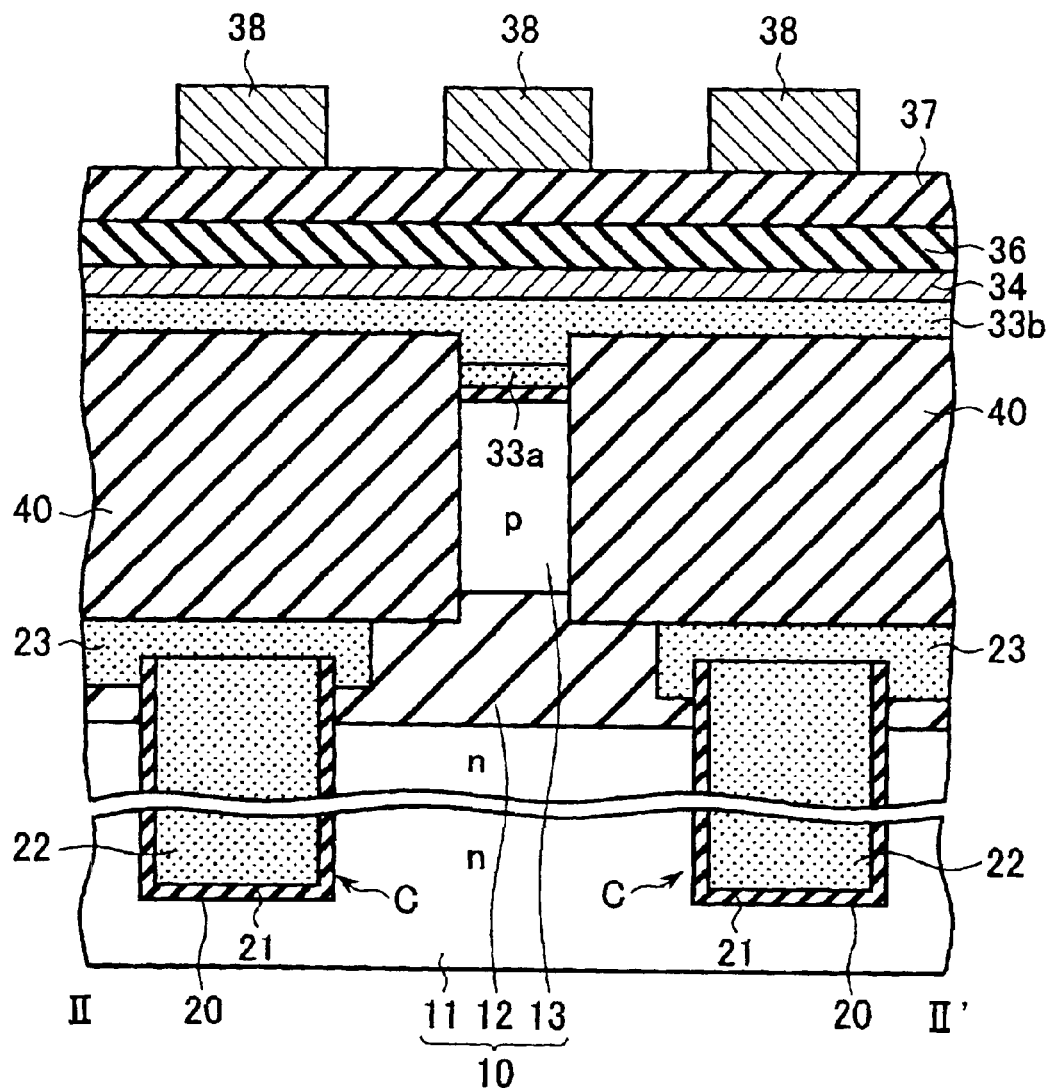
FIG. 3 depicts in cross-section a structure of the cell array taken along line II–II' of FIG. 1.

As better shown in FIG. 2, the individual capacitor C is fabricated by a process having the steps of forming on a sidewall at the lower part of groove 20 a capacitor insulation film 21 made for example of oxide/nitride (ON) material and then burying in this groove 20 storage electrode 22 formed of an n-type impurity-doped polycrystalline silicon or "polysilicon" layer. The capacitor C is arranged with the n-type silicon substrate 11 as a common plate electrode for all the memory cells involved. The storage electrode 22 has an upper end which is located at a level corresponding to a vertically intermediate or "mid" position along the thickness of silicon oxide film 12. A buried strap 23 for connecting together this storage electrode 22 and its associated transistor Q is made of n-type impurity-doped polysilicon or the like in a way such that strap 23 continues on storage electrode 22.

The buried strap 23 is also adaptable for use as the impurity diffusion source of an n ($n^+$) type diffusion layer 31 at lower part of the transistor Q. More specifically, impurities residing within the buried strap 23 or alternatively those of the storage electrode 22 are outdiffused into the p-type silicon layer 13, resulting in formation of $n^+$-type diffusion layer 31. Very importantly, the buried strap 23 is specifically buried so that it comes into contact with p-type silicon layer 13 only at the bottom surface thereof. To do this, a groove diameter enlarged section or a "width-increased groove portion" 25 is formed at upper part of groove 20 with storage electrode 22 buried therein, which section is definable by laterally etching the silicon oxide film 12 to thereby let it recede or "retreat." The buried strap 23 is buried in the width-increased groove portion 25 so that it is in contact only with the bottom surface of p-type silicon layer 13 to ensure that strap 23 overlaps storage electrode 22. Buried strap 23 has its upper part that is covered or coated with an insulative film 24 for use as a "cap insulation" layer.

A gate insulation film 30 is formed on a sidewall of the p-type silicon layer 13, which is exposed at the upper part of the groove 20 with the cap insulation film 24 buried therein. Then, a polysilicon layer 33a is buried. This layer 33a serves as a transistor gate electrode. An upper diffusion layer 32 of transistor Q is formed in a top surface of p-type silicon layer 13. In this way, source/drain diffusion layers 31, 32 are formed at the upper part of such capacitor-buried groove 20 through impurity diffusion from the upper and lower surfaces of p-type silicon layer 13, resulting in fabrication of the intended vertical transistor Q, also known as verticalaccess transistor in the trench DRAM cell.

The polysilicon layer 33a for later use as the gate electrode of transistor Q is separated in each element region, by a to-be-later-effectuated burying process of an element isolating insulative film 40. And, a polysilicon layer 33b and WSi$_2$ layer 34 are stacked or laminated so that these overlap polysilicon layer 33a. This multilayer film is patterned to form parallel word lines WL extending in one direction. These word lines are coated at upper surfaces with a silicon nitride film 36 and an interlayer dielectric (ILD) film 37, on which bit lines (BL) 38 are formed to cross the word lines WL. The bit lines 38 include the one shown in FIG. 2 that is brought into contact with the $n^+$-type diffusion layer 32 at a central portion of an island-like element region, i.e. between two pass-through word lines, also called "pass" word lines. At this bit-line contact BLC, an $n^+$-type diffusion layer 35 overlapping the $n^+$-type diffusion layer 32 is formed through a contact hole, with a contact plug 39 being buried in the contact hole.

With this illustrative embodiment, the SOI substrate used comes with the buried strap 23 being embedded in the width-increased groove portion 25 of each groove 20 while letting it be contacted with the p-type silicon layer 13 only at the bottom surface thereof. And, the lower diffusion layer 31 of vertical transistor Q is fabricated through upward impurity diffusion from the buried strap 23 to the bottom surface of the silicon layer 13. Accordingly, the channel length of such vertical transistor Q will no longer vary under the influence of a change in etch-back amount of the buried strap 23. This in turn makes it possible to improve the channel length controllability to the extent of any possible deviation in thickness of the p-type silicon layer 13 of SOI substrate 10.

Figure 37:
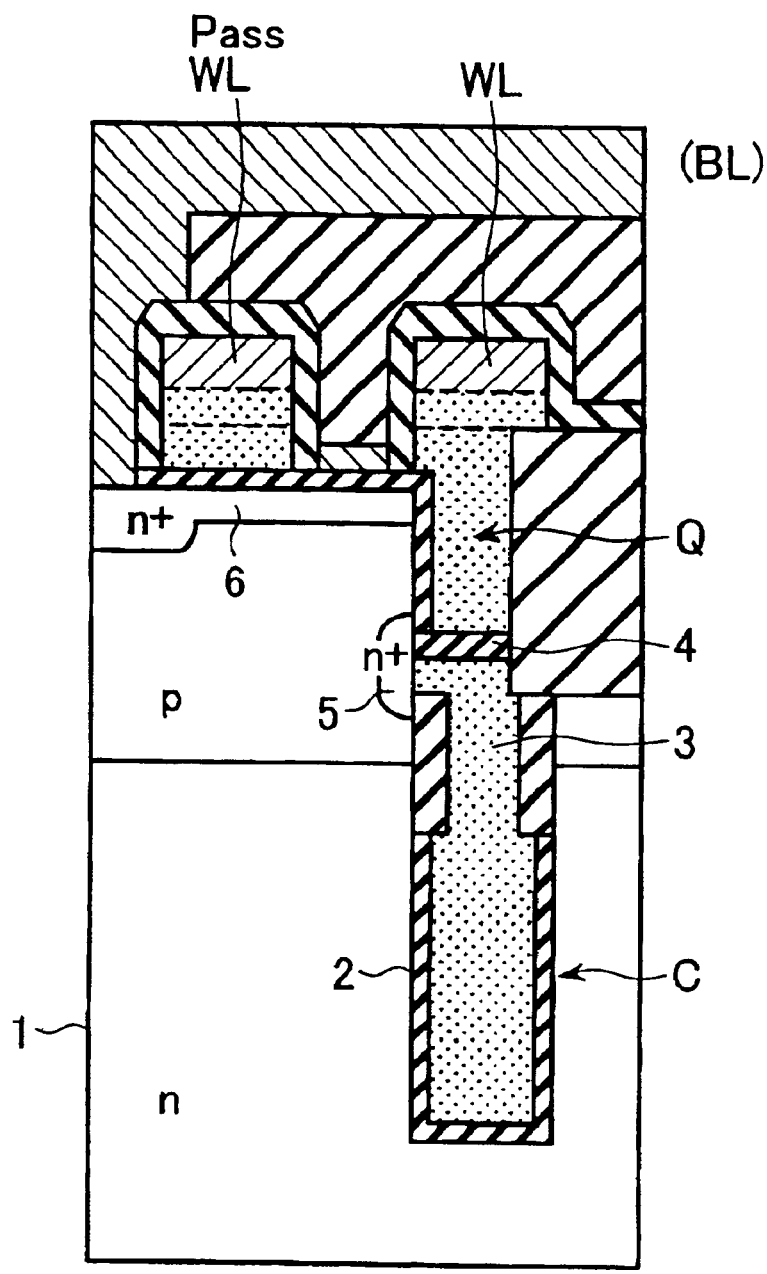
FIG. 37 is a sectional view of one prior art vertical transistor-based DRAM cell array structure.

The storage electrode 22 of capacitor C is electrically isolated and separated from the silicon substrate 11 by the capacitor insulation film 21; similarly, the diffusion layers of each transistor Q are also electrically isolated from silicon substrate 11 by silicon oxide film 12. Due to this, the ability to stand up against so-called soft errors and noises, i.e. soft-error/noise withstandability, stays high. Further, if the silicon oxide film 12 is absent then suppression of parasitic transistors occurring due to the presence of the buried strap 23 would inevitably call for formation of a sidewall dielectric film with certain thickness on a sidewall at part whereat the buried strap 23 is to be formed, as shown in the prior art of FIG. 37. Fortunately with the illustrative embodiment, the buried strap 23 is embedded in the silicon oxide film 12 so that no "special" schemes are required to suppress such parasitic transistors.

An explanation will next be given of a fabrication process of the cell array in accordance with this embodiment with reference to FIGS. 4 through 9, while focusing attention on the sectional view of FIG. 2. See first FIG. 4. This diagram illustrates a device structure in which the capacitors C have already been fabricated. In this state, the fabrication process starts with formation of a mask pattern on the SOI substrate 10. This mask is formed of a buffer oxide film 41 and silicon nitride film 42. Then, anisotropically etch the SOI substrate 10 by reactive ion etch (RIE) techniques to form a "trench"-like groove 20 at each position of capacitor C shown in FIG. 1, which is deep enough to reach the inside of n-type silicon substrate 11 after penetration through a lamination of silicon layer 13 and oxide film 12. Thereafter, although not specifically depicted in this drawing, an $n^+$-type diffusion layer is formed from the bottom of each groove 20 when the need arises. This is for plate electrode resistivity reduction purposes.

Figure 4:
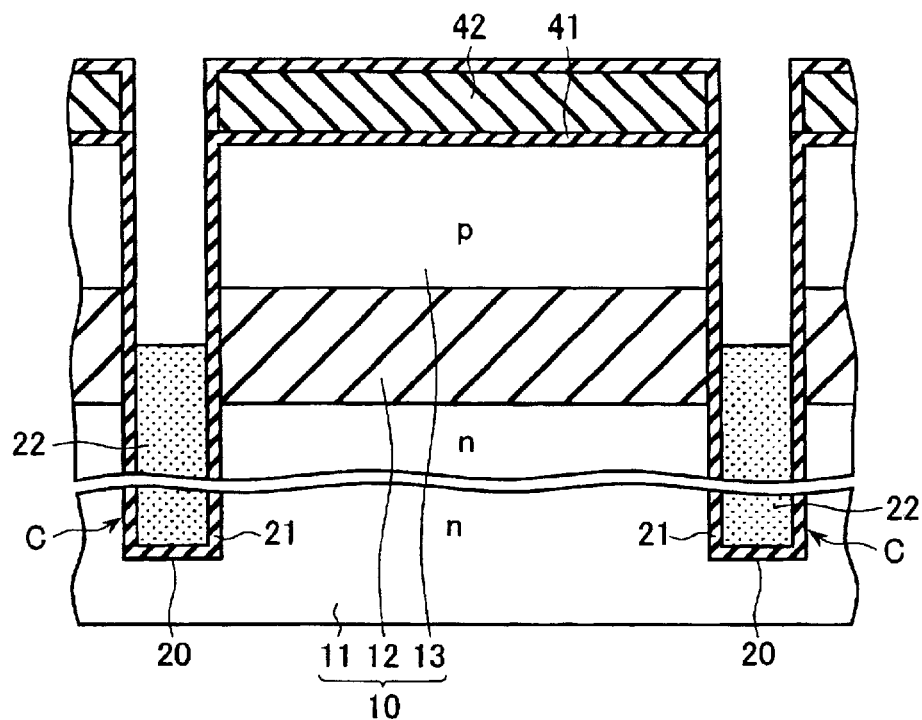
FIGS. 4 through 9 illustrates, in schematic cross-section, some of the major steps in the fabrication of the DRAM cell structure embodying the invention.

Then, after having formed on the groove 20's sidewall a capacitor insulation film 21 such as an ON film or equivalents thereto, deposit a polysilicon material doped with a chosen n-type impurity, followed by etch-back using RIE techniques to bury it part of the groove 20—in other words, half-bury the polysilicon in groove 20 as shown in FIG. 4. The storage electrode 22 is thus formed. Let the upper surface of storage electrode 22 be located at a level corresponding to an intermediate or "mid" part of the silicon oxide film 12 of SOI substrate 10.

Figure 5:
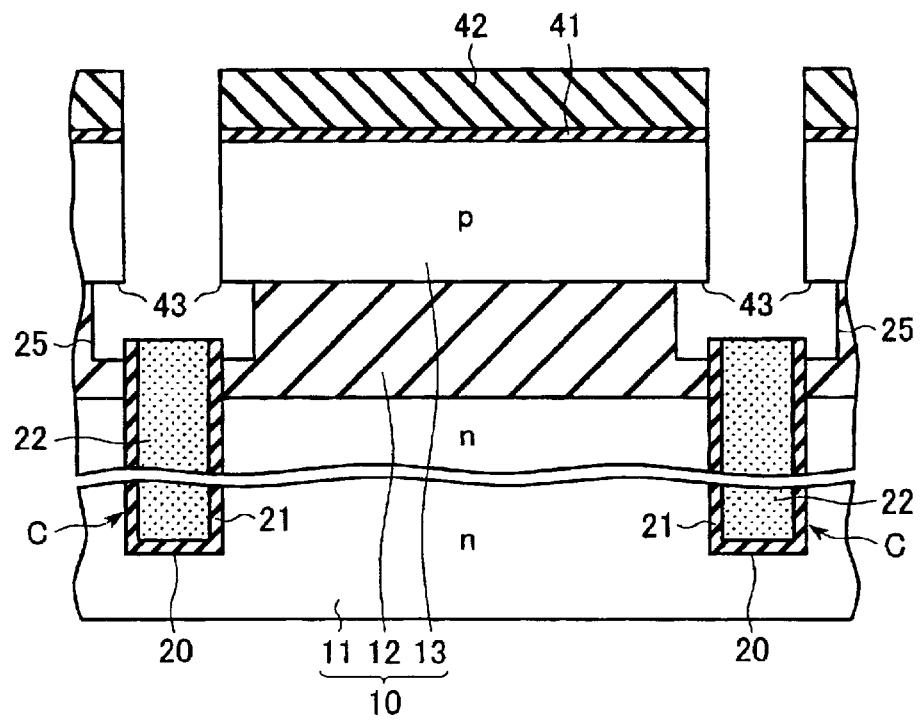

Thereafter, as shown in FIG. 5, remove through etching treatment a portion of the capacitor insulation film 21 overlying the storage electrode 22; further, HF solution is used to laterally etch the silicon oxide film 12 as exposed to the groove 20 to thereby force it recede or retreat by a prespecified distance, thus forming the width-increased groove portion 25 with the lower surface(i.e. bottom surface) 43 of p-type silicon layer 13 exposed.

Figure 6:
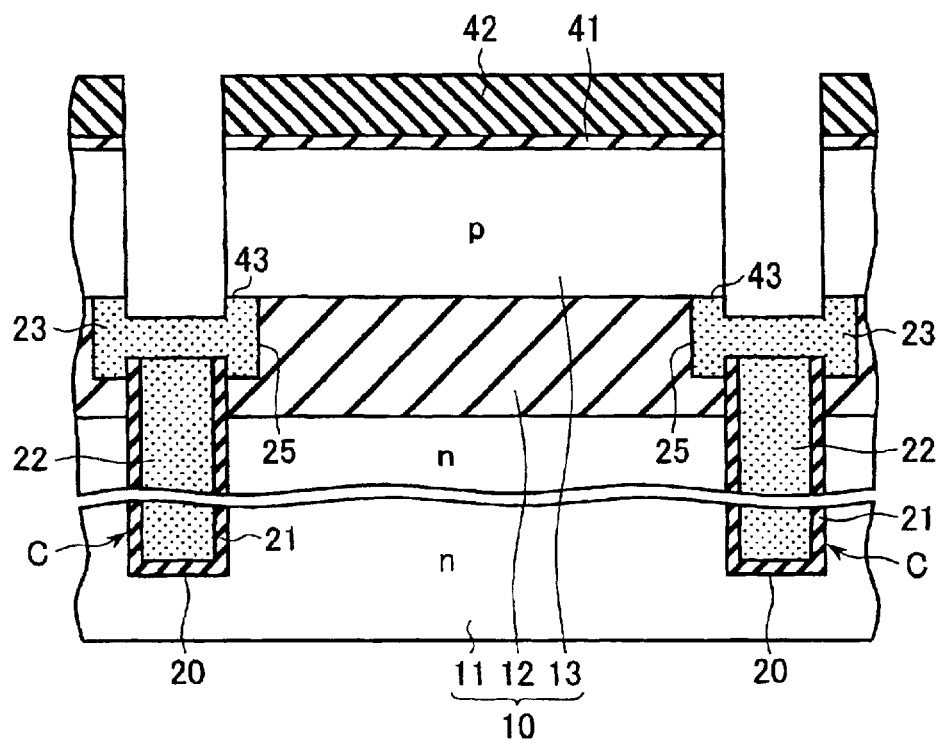

And, as shown in FIG. 6, bury a strap 23 in the width-increased groove portion 25 within the groove 20 in such a manner that the strap 23 overlaps the storage electrode 22. Practically, this strap 23 is buried by a process having the steps of depositing an n-type impurity-doped polysilicon film and then applying thereto etch-back treatment using anisotropic etch techniques such as RIE methods or the like. The buried strap 23 is to be buried in the width-increased groove portion 25 so that its upper surface is lower in level than the bottom surface 43 of p-type silicon layer 13—in other words, buried strap 23 is in contact with the p-type silicon layer 13 only at the bottom surface 43.

Figure 7:
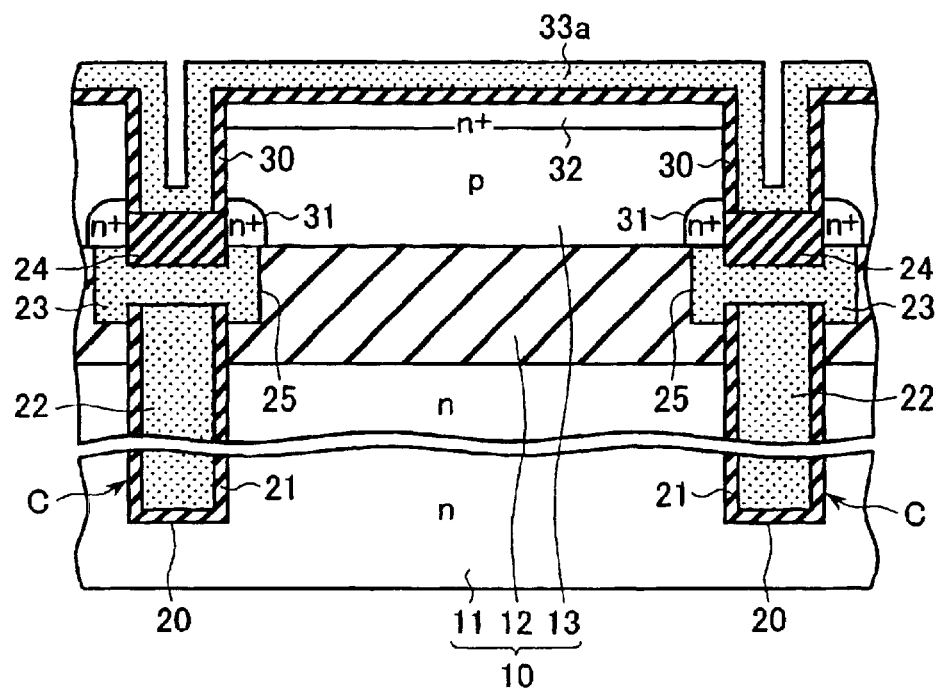

Thereafter, as shown in FIG. 7, fabricate in each groove 20 a cap insulation film 24, such as a silicon oxide film or the like which covers the buried strap 23. This cap insulation film 24 is for electrical isolation between a storage node and gate electrode to be later formed by burying process on the cap film 24. In this respect, the cap insulation film 24 is formed by burying a silicon oxide film or else. Alternatively, the film may be replaced with a silicon oxide film obtainable through oxidation of the surface of buried strap 23 or any available composite or "hybrid" films of them. Still alternatively, a transistor gate insulation film to be later formed over the buried strap 23 can also do double-duty as such cap insulation film.

Next, ion implantation is done to form an $n^+$-type diffusion layer 32 in a top surface portion of the p-type silicon layer 13. In addition, form by thermal oxidation a gate insulation film 30 on a sidewall of each groove 20, and then depositing a polysilicon film 33a for use as a transistor gate electrode. During the thermal oxidation process of gate insulation film 30 or thermal annealing processes to be later effectuated, the n-type impurity-doped buried strap 23 behaves to outdiffuse into the p-type silicon layer 13, thereby forming an $n^+$-type diffusion layer 31 in the bottom surface 43 of p-type silicon layer 13.

Figure 8:
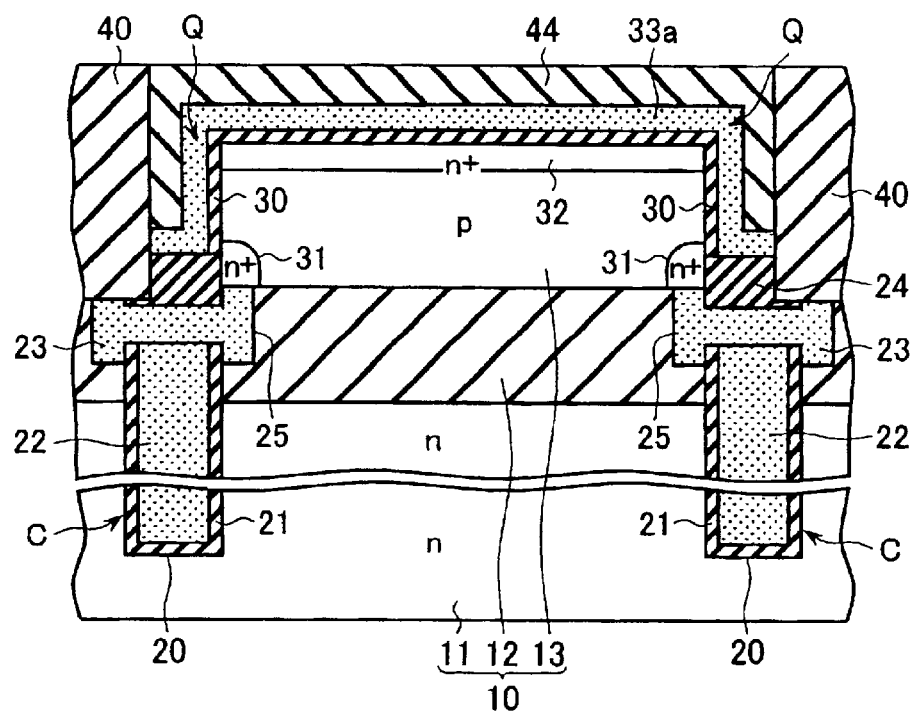

Next, as shown in FIG. 8, element isolation process is done by shallow trench isolation (STI) methods. More specifically, fabricate a patterned mask formed of a silicon nitride film 44. Then, anisotropically etch by RIE techniques the polysilicon film 33a and gate insulation film 30 along with the cap insulation film 24 and p-type silicon layer 13 to form element isolation grooves required. Thereafter, bury an element isolation dielectric film 40, which is typically made of silicon oxide or other similar suitable materials. Preferably the element isolation dielectric film 40 is subjected to planarization by chemical-mechanical polishing (CMP) techniques. In the illustrative embodiment the element isolation grooves are formed so that each is deep enough to reach the underlying silicon oxide film 12, thereby defining electrically insulated island-shaped element regions 14 including p-type silicon layers 13, respectively. The p-type silicon layers 13 of such element regions 14, each of which makes up two DRAM cells, are electrically separated and isolated from each other.

Figure 9:
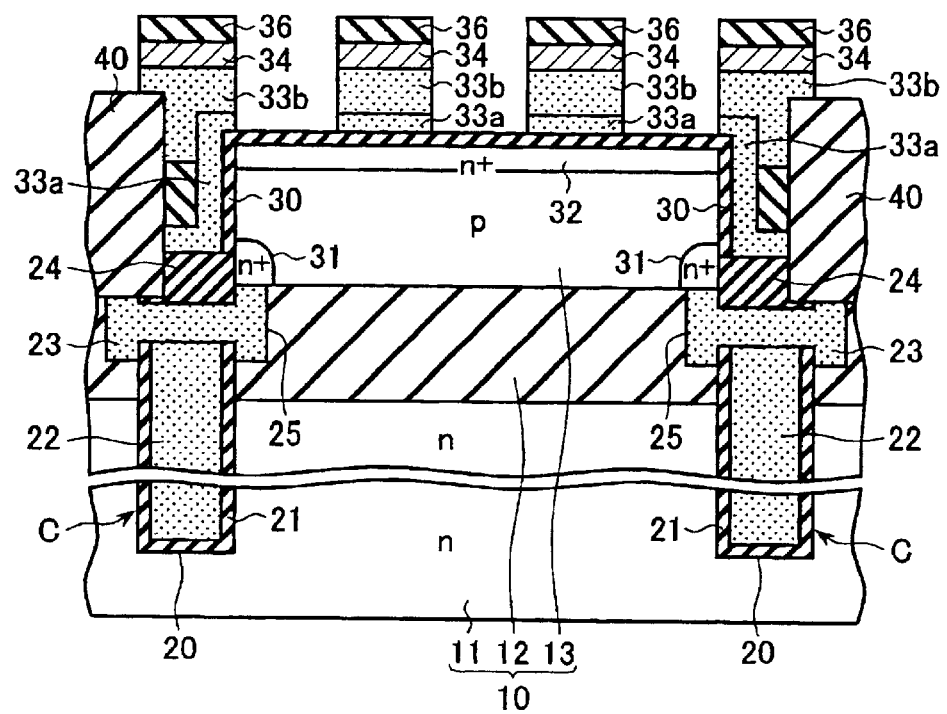

Thereafter, the silicon nitride film 44 which do not reside within grooves 20 are etched away. Then, as shown in FIG. 9, deposit a multilayer lamination of polysilicon film 33b and $WSi_2$ film 34 plus silicon nitride film 36, which is then patterned to form word lines WL.

And, as shown in FIG. 2, form a silicon nitride film on sidewalls of the word lines WL; thereafter, deposit an ILD film 37. Define in this ILD film 37 contact holes, each of which is self-aligned to its corresponding word line WL. Then, form an $n^+$-type diffusion layer 35 through ion implantation. And, after having buried a contact plug 39 in each contact hole, fabricate bit lines 38, although only one of them is visible in FIG. 2.

In accordance with the manufacturing process of this embodiment, etch-back control of the buried strap 23 is done to merely ensure that it is deeper than the thickness of p-type silicon layer 13. This in turn guarantees that the buried strap 23 is contacted only with the bottom surface of p-type silicon layer 13. Accordingly, it is no longer required to perform serious etchback control for accurate control of the channel length of an individual transistor, thus improving process yields in the manufacture of the intended memory cell array structure.

In this embodiment, the above-noted electrode materials and dielectric materials are mere examples, and are variously selectable from among a variety of kinds of materials. Additionally, as previously stated, a key to the buried strap 23 is to perform etch-back processing so that it is deeper than the bottom surface level of p-type silicon layer 13. For instance, the etchback may be done causing it to reach the upper surface of the storage electrode 22 of a capacitor C associated therewith. Note however that in this case, it will be preferable that a thin silicon oxide film or the like for use as an etching stopper be preformed on the surface of storage electrode 22. This makes it possible to suppress or preclude unwanted etching of the storage electrode 22. It should be noted in this case that the buried strap 23 is to be left only in the width-increased groove portion 25 as defined and expanded outside of the groove 20 through lateral etching of the silicon oxide film 12, thus causing a risk of deficient electrical interconnection with the storage electrode 22 of capacitor C. One preferable remedy for such risk is to overetch the capacitor insulation film 21 at the process step of FIG. 5 to ensure that the buried strap 23 comes into contact with a side face of storage electrode 22.

[Embodiment 2]

Figure 10:
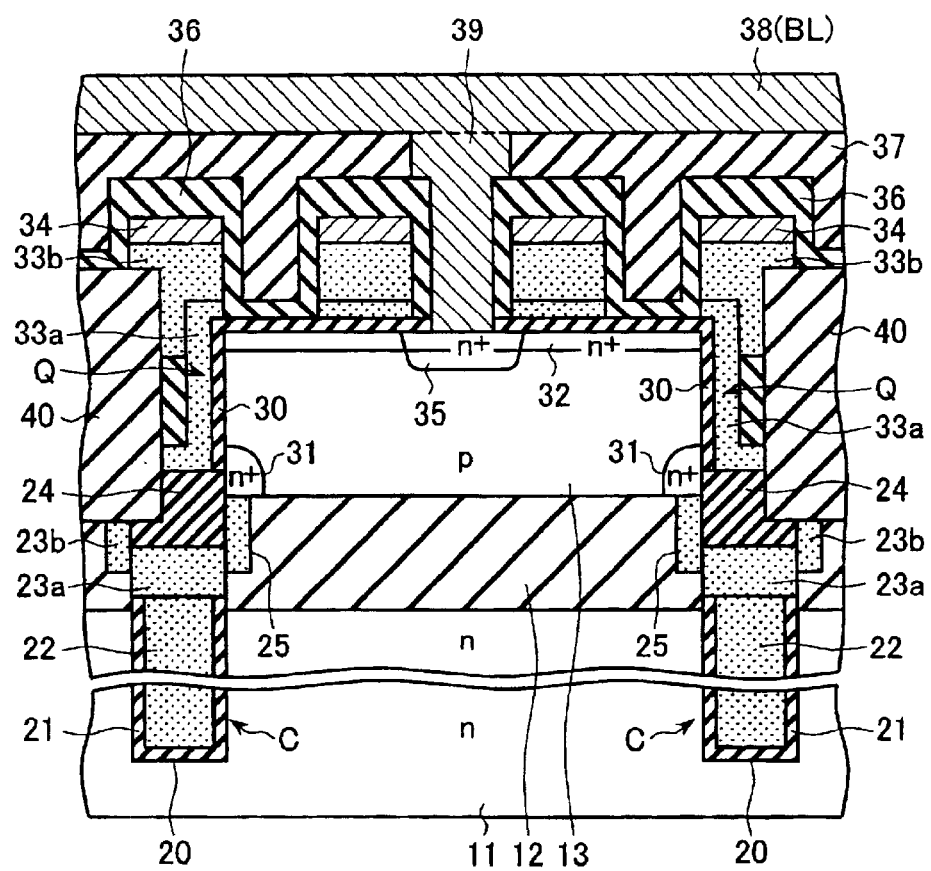
FIG. 10 is a diagram showing a sectional view of a DRAM cell array in accordance with another embodiment of this invention in a way corresponding to that shown in FIG. 2.

Turning now to FIG. 10, there is shown a cross-sectional view of a trench DRAM cell array structure in accordance with another embodiment of this invention, in a way corresponding to that of the previously discussed embodiment of FIG. 2. Its plan view is the same as that shown in FIG. 1. A difference of the FIG. 10 embodiment from the above-stated embodiment is that the buried strap 23 is designed to have a two- or "double"-layer structure that consists essentially of n-type polysilicon films 23a, 23b stacked over each other. A first one of these two layers, i.e. polysilicon (poly-Si) film 23a, is fabricated prior to formation of the width-increased groove portion 25 in such a manner such that it is multilayered on a sidewall of the groove 20 at upper part than the storage electrode 22 of capacitor C in the state that no capacitor insulation films are present. And, after having formed the width-increased groove portion 25, the remaining, second-layered poly-Si film 23b is buried in the width-increased groove portion 25 while being contacted with only the bottom surface of p-type silicon layer 13.

A fabrication process of this embodiment structure will be set forth in detail with reference to FIGS. 11 to 17. See FIG. 11, which is substantially the same as FIG. 4 of the previous embodiment in that a structure with capacitors C having been formed therein is depicted. Firstly, fabricate on SOI substrate 10 a mask pattern formed of a buffer oxide film 41 and silicon nitride film 42. Then, etch SOI substrate 10 by RIE methods to form therein "trench" grooves 20, each of which is deep sufficient to reach the inside of n-type silicon substrate 11 after penetration through the silicon layer 13 and oxide film 12. Thereafter, although not specifically depicted in this drawing, an n$^+$-type diffusion layer is formed from the bottom of each groove 20 when the need arises. This is for plate electrode resistivity reduction purposes.

Figure 11:
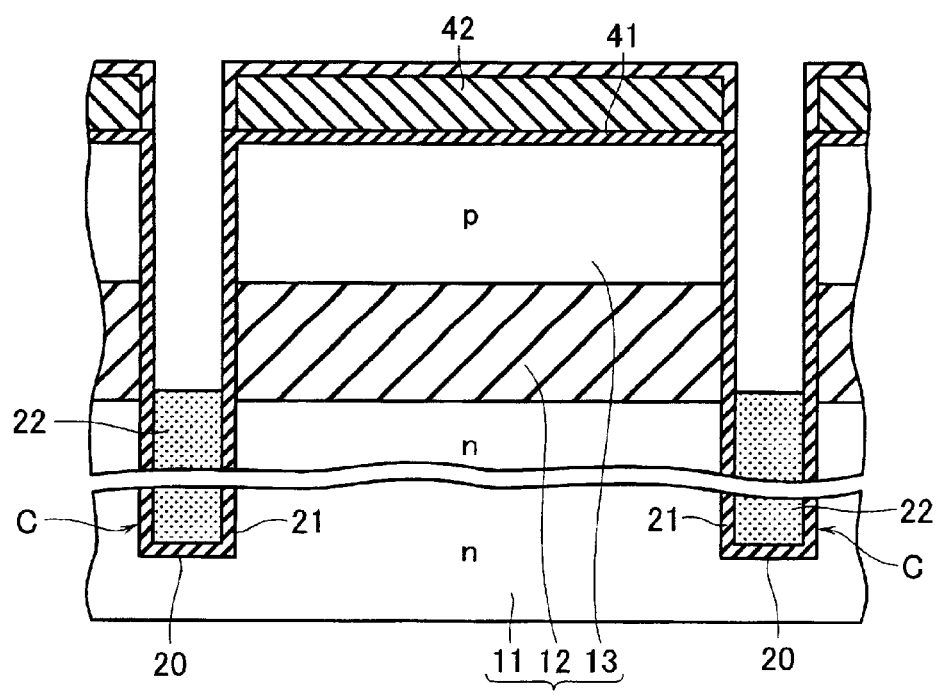
FIGS. 11 to 17 illustrates, in cross-section, some of the major steps in the formation of the DRAM cell structure of FIG. 10.

Then, after having formed on the groove 20's sidewall a capacitor insulation film 21 formed of an ON film or equivalents thereto, deposit a polysilicon material doped with a chosen n-type impurity, followed by etch-back using RIE techniques to half-bury it in the groove 20 as shown in FIG. 11. The storage electrode 22 is thus formed. Let the upper surface of storage electrode 22 be located at a level corresponding to an intermediate or "mid" part of the silicon oxide film 12 of SOI substrate 10.

Figure 12:
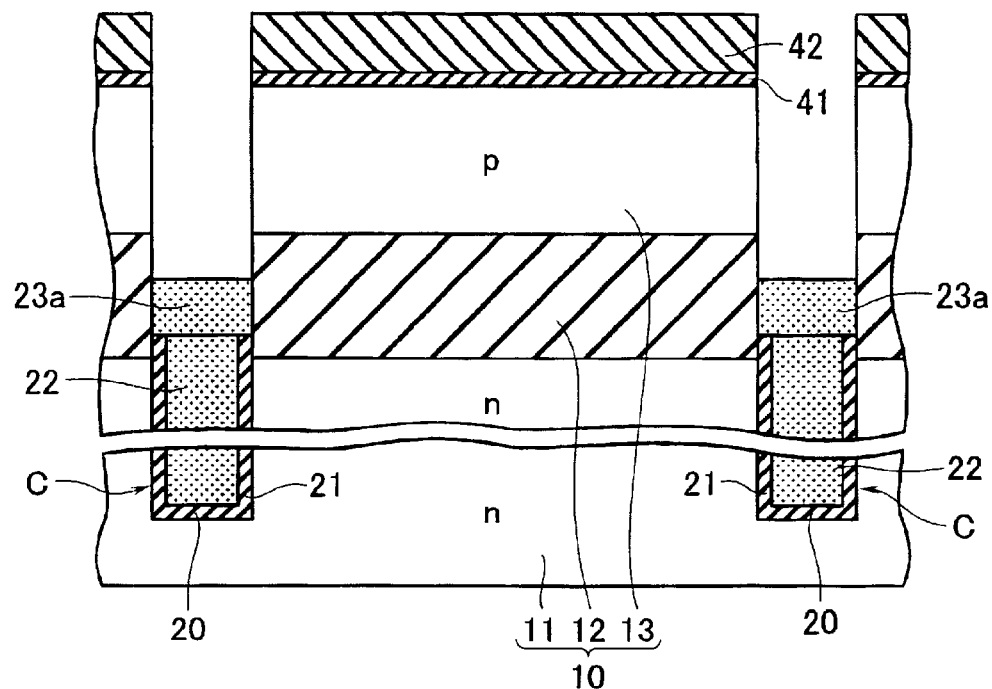

Thereafter, as shown in FIG. 12, etch away a portion of the capacitor insulation film 21 overlying each storage electrode 22; then, bury through deposition and etch-back processes an n-type impurity-doped polysilicon film 23a in each groove 20. Alternatively a method for selective growth of such poly-Si film 23a on storage electrode 22 is employable. At this time, appropriate process control is done causing the upper surface of poly-Si film 23a to be placed at an intermediate level or "interlevel" between the top and bottom surfaces of silicon oxide film 12.

Figure 13:
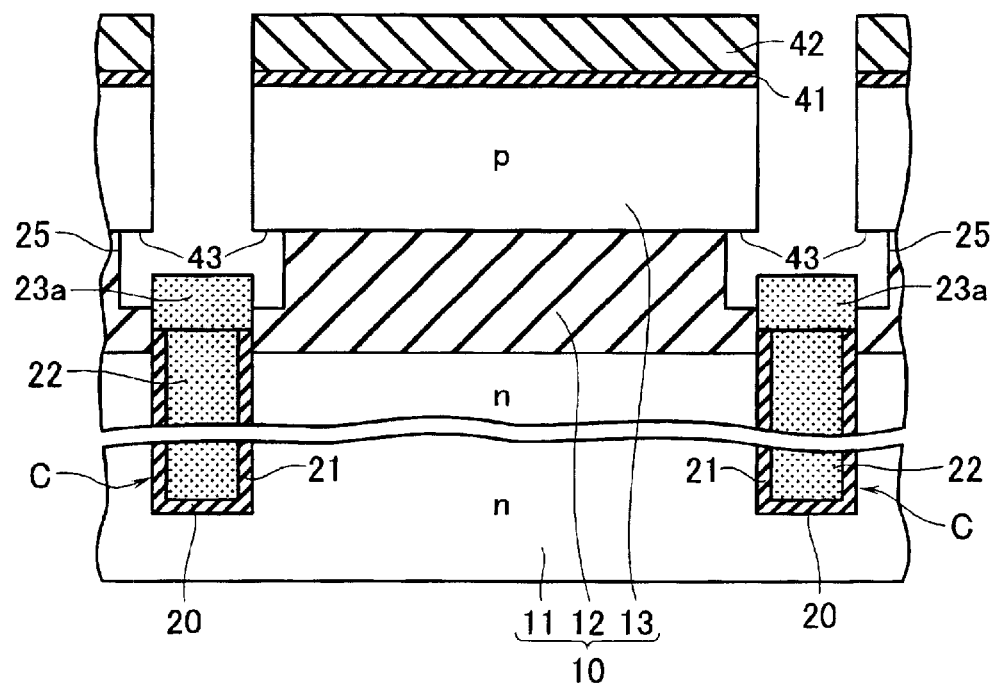

In this state, as shown in FIG. 13, etch the silicon oxide film 12 by isotropic etching techniques using HF solution or equivalents thereof, causing film 12 to recede laterally. Whereby, a width-increased groove portion 25 is formed with the bottom surface 43 of p-type silicon layer 13 being partly exposed.

Figure 14:
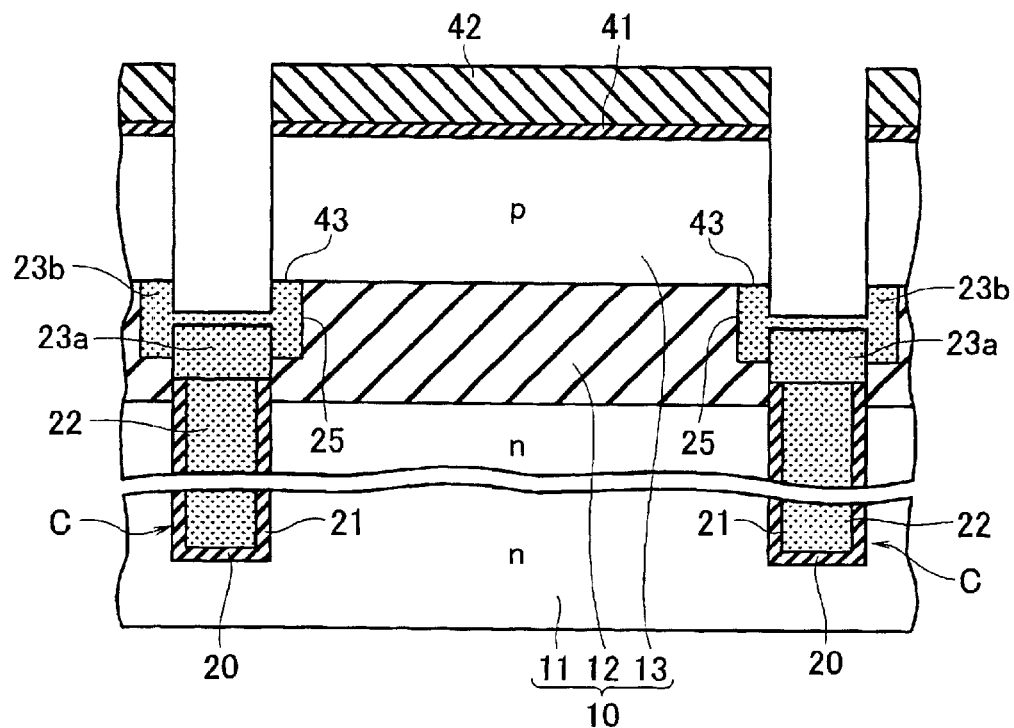

Then, as shown in FIG. 14, bury therein an n-type impurity-doped polysilicon film 23b through deposition and etchback processes in such a manner that this poly-Si film 23b is in contact with p-type silicon layer 13 only at the bottom surface 43 thereof. Whereby, a buried strap 23 is formed of two polysilicon films 23a and 23b. Although in FIG. 14 the poly-Si film 23b is designed so that it resides on poly-Si film 23a, the etchback process may be done to the extent that the upper surface of film 23a is exposed.

Figure 15:
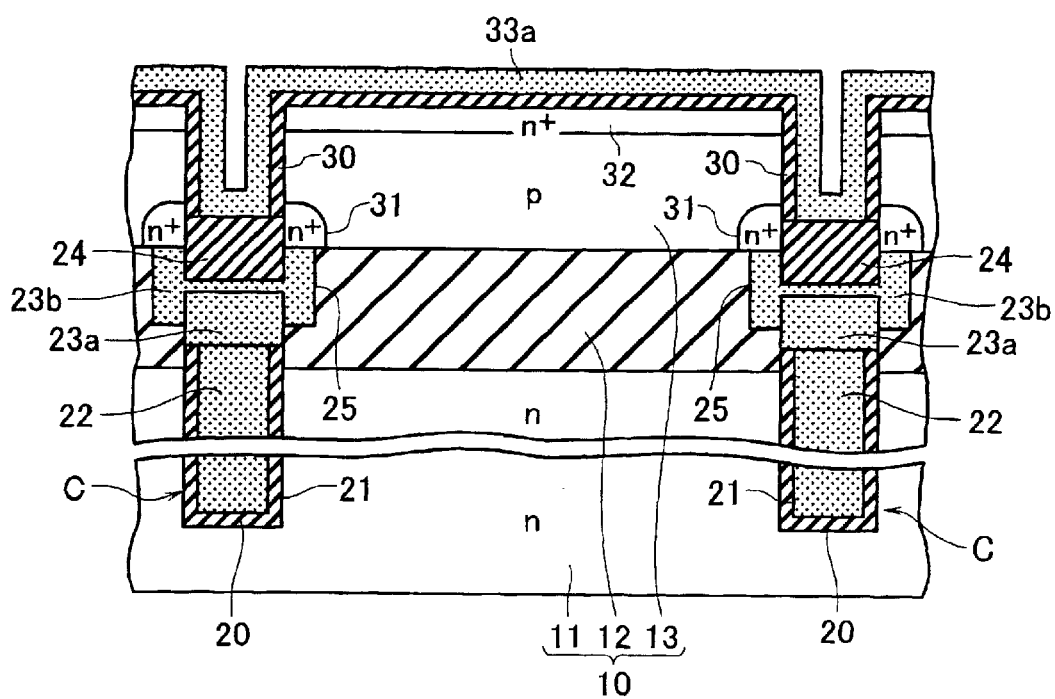

Thereafter, as shown in FIG. 15, fabricate in each groove 20 a cap insulation film 24, such as a silicon oxide film or the like which covers the buried strap 23. This cap insulation film 24 is for electrical isolation between a storage node and gate electrode to be later formed by burying process on or over the cap film 24. In this respect, similar results are obtainable by burying of a silicon oxide film or else. Alternatively, the film may be replaced with a silicon oxide film obtainable through oxidation of the surface of buried strap 23 or any available composite or "hybrid" films of them. Still alternatively, a transistor gate insulation film to be later formed also on buried strap 23 may also be for use as such cap insulation film.

Next, ion implantation is done to form an n$^+$-type diffusion layer 32 in a top surface portion of the p-type silicon layer 13. In addition, form through thermal oxidation a gate insulation film 30 on a sidewall of each groove 20, resulting in deposition of a polysilicon film 33a for use as a transistor gate electrode. During the thermal oxidation process of gate insulation film 30 or thermal annealing processes to be later effectuated, the n-type impurity of the buried strap 23 exhibits upward outdiffusion into the p-type silicon layer 13, thereby forming an n$^+$-type diffusion layer 31 in the bottom surface of the silicon layer 13.

Figure 16:
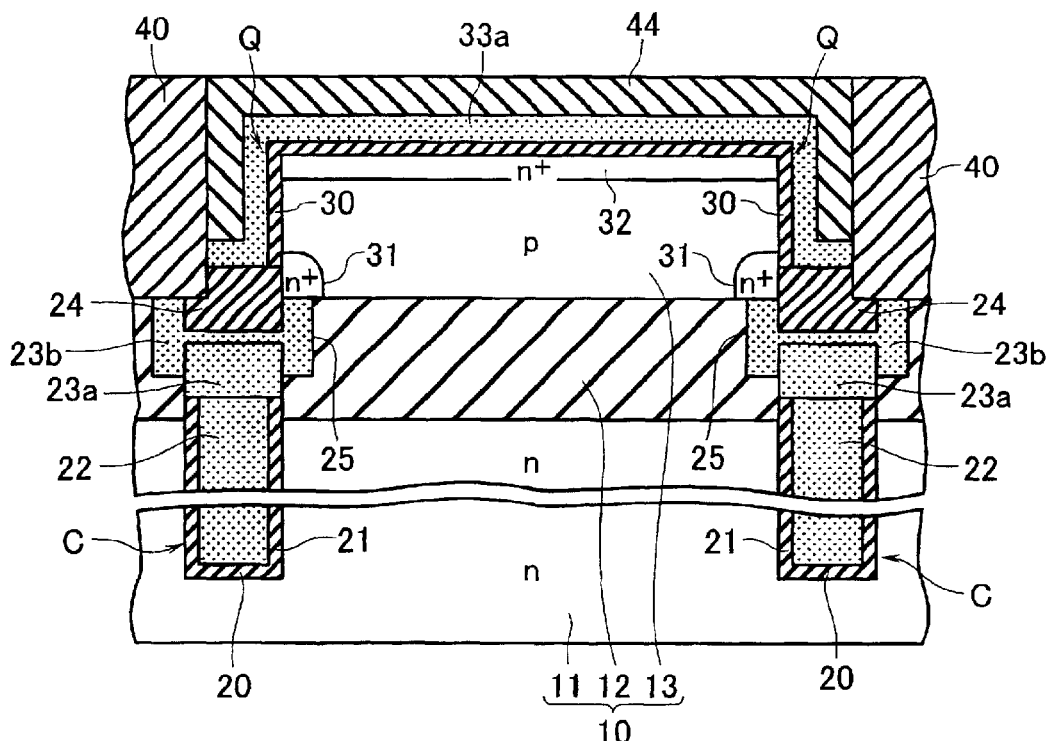

Next, as shown in FIG. 16, element isolation process is done by STI methods. More specifically, fabricate a mask pattern formed of a silicon nitride film 44. Then, anisotropically etch by RIE the polysilicon film 33a and gate insulation film 30 along with the cap insulation film 24 and p-type silicon layer 13 to form element isolation grooves required. Thereafter, bury an element isolation dielectric film 40, which is typically made of silicon oxide or other similar suitable materials. Preferably the element isolation dielectric film 40 is subjected to planarization by CMP techniques. In the illustrative embodiment the element isolation grooves are formed so that it is deep enough to reach the underlying silicon oxide film 12, thereby defining electrically insulated island-shaped element regions 14 including p-type silicon layers 13, respectively. The p-type silicon layers 13 of such element regions 14, each of which makes up two DRAM cells, are electrically separated and isolated from each other.

Figure 17:
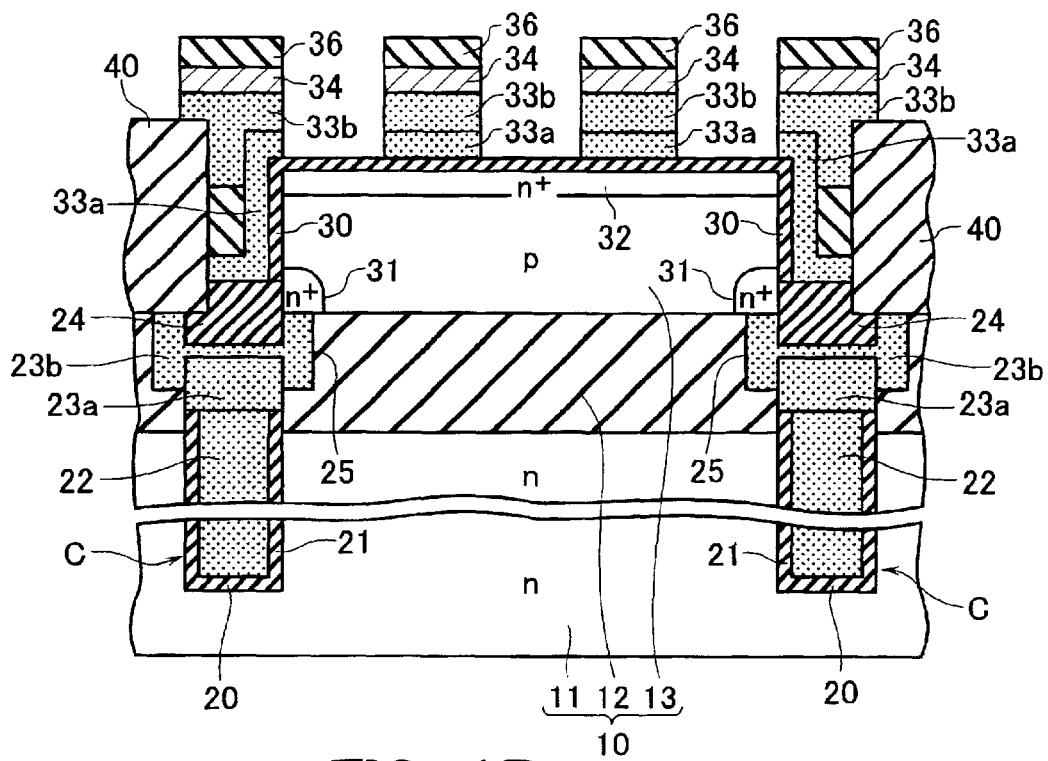

Thereafter, those portions of the silicon nitride film 44 which do not reside within grooves 20 are etched away. Then, as shown in FIG. 17, deposit a multilayer lamination of polysilicon film 33b and WSi$_2$ film 34 plus silicon nitride film 36, which is then patterned into word lines WL.

And, as shown in FIG. 10, form a silicon nitride film on sidewalls of the word lines WL; thereafter, deposit an ILD film 37. Define in this ILD film 37 contact holes, each of which is self-aligned to its corresponding word line WL. Then, form an n$^+$-type diffusion layer 35 through ion implantation. And, after having buried a contact plug 39 in each contact hole, fabricate bit lines 38, although only one of them is visible in FIG. 10.

As per this embodiment, letting the buried strap 23 be formed of the double-layer structure of the polysilicon films 23a, 23b makes it possible to insure electrical connection between the storage electrode 22 and buried strap 23 without having to sufficiently perform overetching of the capacitor insulation film(s).

[Embodiment 3]

Figure 18:
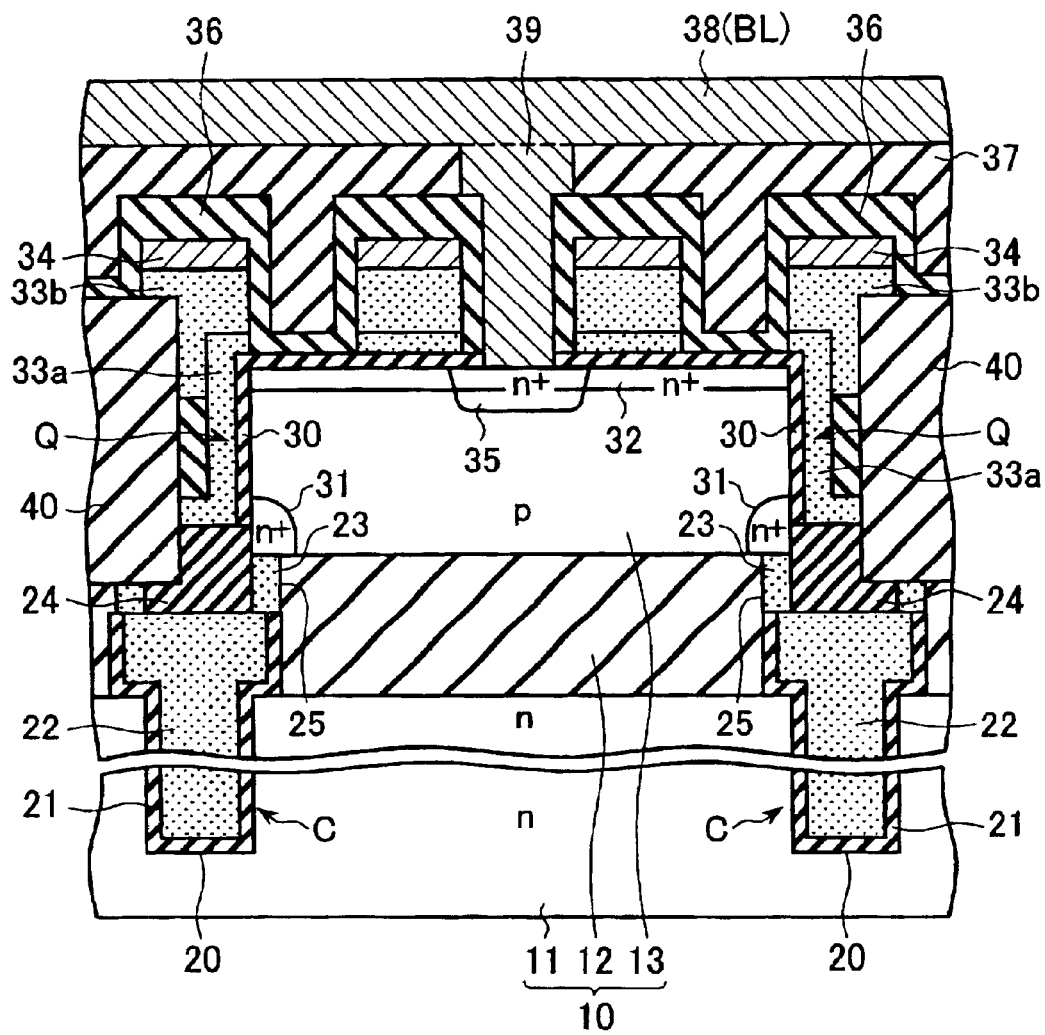
FIG. 18 is a diagram showing a sectional view of a DRAM cell array in accordance with still another embodiment of this invention, corresponding to that shown in FIG. 2.

Referring next to FIG. 18, there is shown a sectional view of a trench DRAM cell array structure in accordance with yet another embodiment of this invention, in a way corresponding to that of the previously stated embodiment of FIG. 2. Its plan view is the same as that shown in FIG. 1. The FIG. 18 embodiment is different from the above-stated embodiment in that i) the width-increased groove portion 25 is formed over the entire thickness range of the silicon oxide film 12, ii) the capacitor C's storage electrode 22 is buried so that its upper surface is located at the width-increased groove portion 25 and thus has an increased area, and iii) its overlying buried strap 23 is so formed as to come into contact with only the bottom surface of p-type silicon layer 13.

Figure 19:
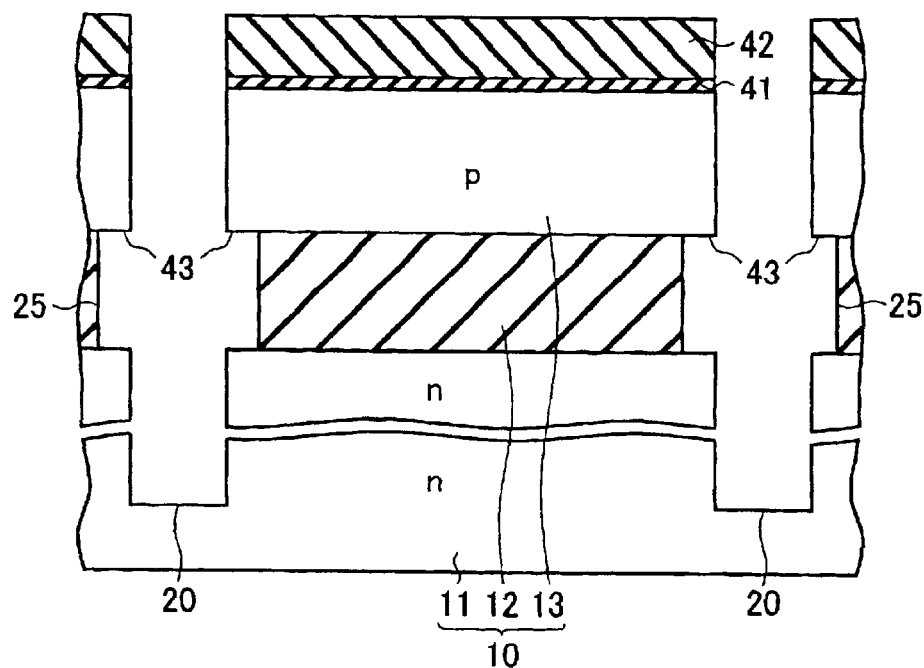
FIGS. 19 to 24 depicts, in cross-section, some of the major steps in the manufacture of the DRAM cell structure of FIG. 18.

A fabrication process of the FIG. 18 structure will be described with reference to FIGS. 19 to 24. As shown in FIG. 19, after having formed grooves 20 for capacitor use by RIE methods, oxide film etching is subsequently done using a chosen HF solution, causing terminate end faces of silicon oxide film 12 to recede. This results in formation of a width-increased groove portion 25 with the bottom surface 43 of p-type silicon layer 13 being exposed.

Figure 20:
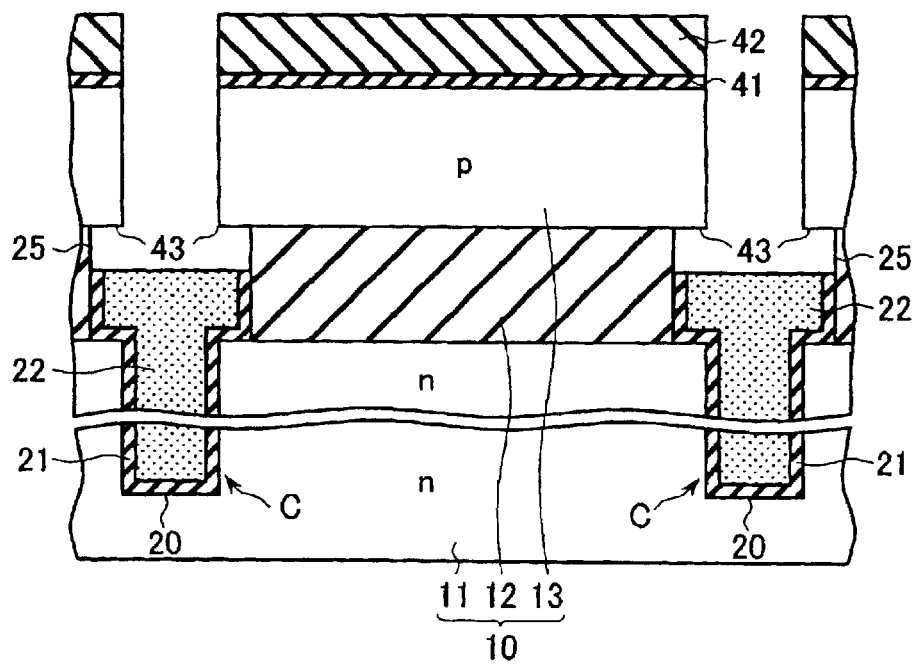

Thereafter, as shown in FIG. 20, form a capacitor insulation film 21; then, bury therein storage electrodes 22 through n-type impurity doped polysilicon film deposition and etchback processes. Let the upper surface of each storage electrode 22 be placed at an interlevel between the top and bottom surfaces of a silicon oxide film 12 while etching away the capacitor insulation film overlying the storage electrode 22.

Figure 21:
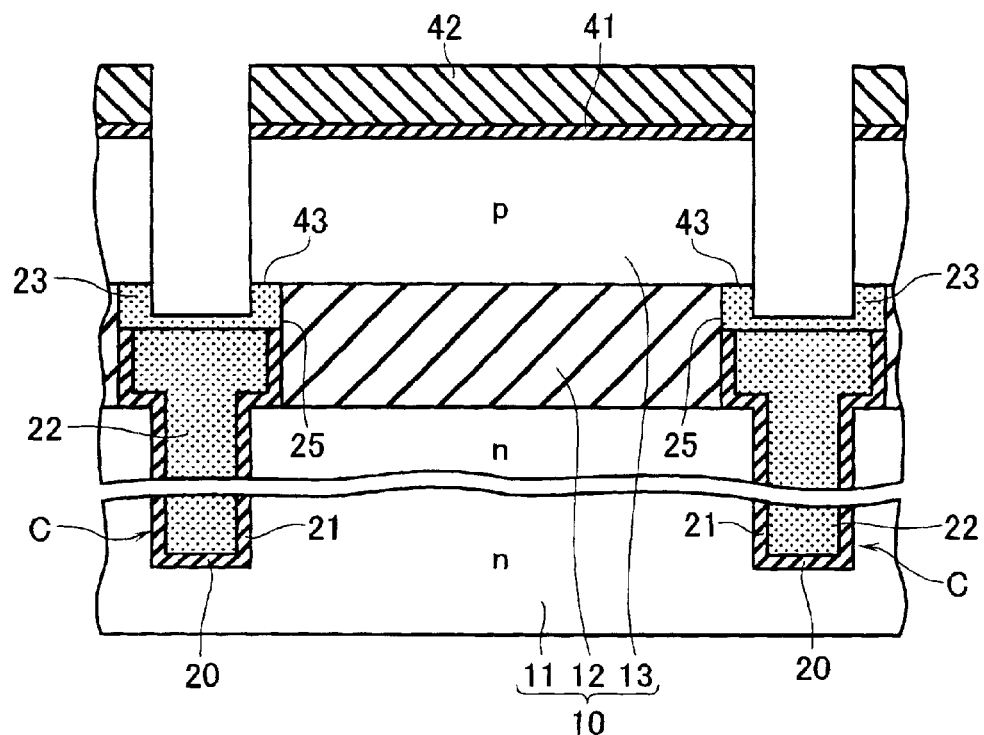

And, as shown in FIG. 21, bury a strap 23 in the width-increased groove portion 25 within the groove 20 in such a manner that the strap 23 overlaps the storage electrode 22. Practically, this strap 23 is formed by a process having the steps of depositing an n-type impurity-doped polysilicon film and then applying thereto etch-back treatment using anisotropic etch techniques such as RIE methods or the like. The buried strap 23 is to be buried in the width-increased groove portion 25 so that its upper surface is lower in level than the lower surface of p-type silicon layer 13—in other words, buried strap 23 is in contact with the p-type silicon layer 13 only at the lower surface thereof.

Figure 22:
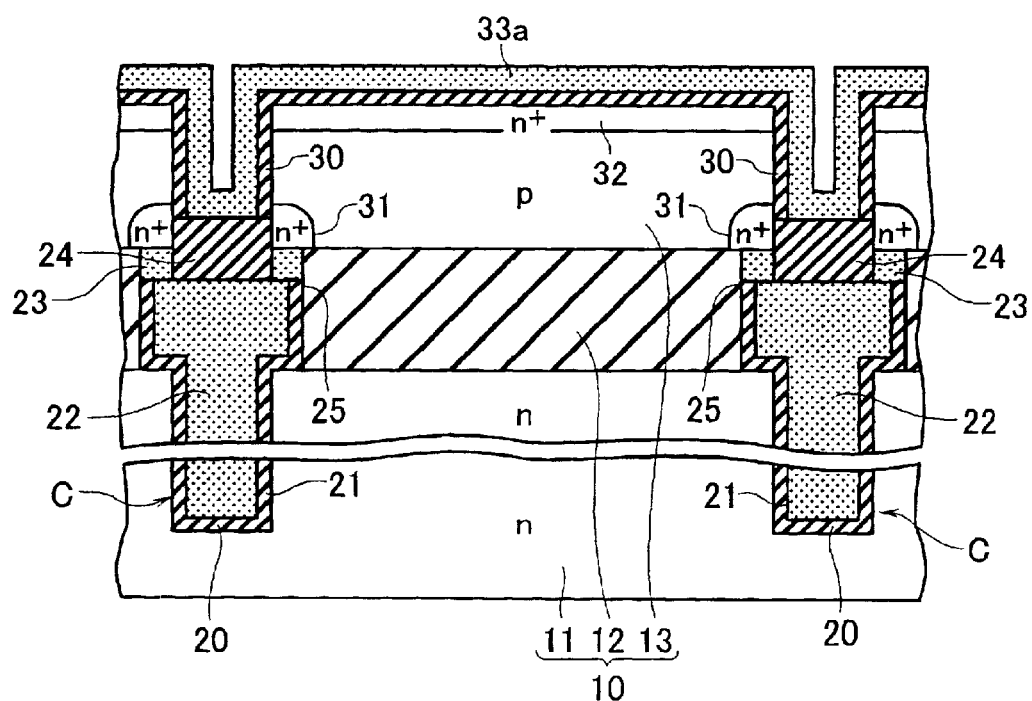

Thereafter, as shown in FIG. 22, bury in each groove 20 a cap insulation film 24, which is formed of a silicon oxide film or else. This cap insulation film 24 is for electrical isolation between a storage electrode 22 and gate electrode to be later formed by burying process on or over the cap film 24. In this respect, similar results are obtainable by burying of a silicon oxide film or else. Alternatively, the film may be replaced with a silicon oxide film obtainable through oxidation of the surface of buried strap 23 or any available composite or "hybrid" films of them. Still alternatively, a transistor gate insulation film to be later formed also on buried strap 23 may be designed to function also as the cap insulation film.

Next, ion implantation is done to form an $n^+$-type diffusion layer 32 in a top surface portion of the p-type silicon layer 13. In addition, form through thermal oxidation a gate insulation film 30 on a sidewall of each groove 20, resulting in deposition of a polysilicon film 33a for use as a transistor gate electrode. During the thermal oxidation process of gate insulation film 30 or thermal annealing processes to be later effectuated, the n-type impurity doped in the buried strap 23 behaves to outdiffuse into the p-type silicon layer 13, thereby forming an $n^+$-type diffusion layer 31 in the bottom surface of p-type silicon layer 13.

Figure 23:
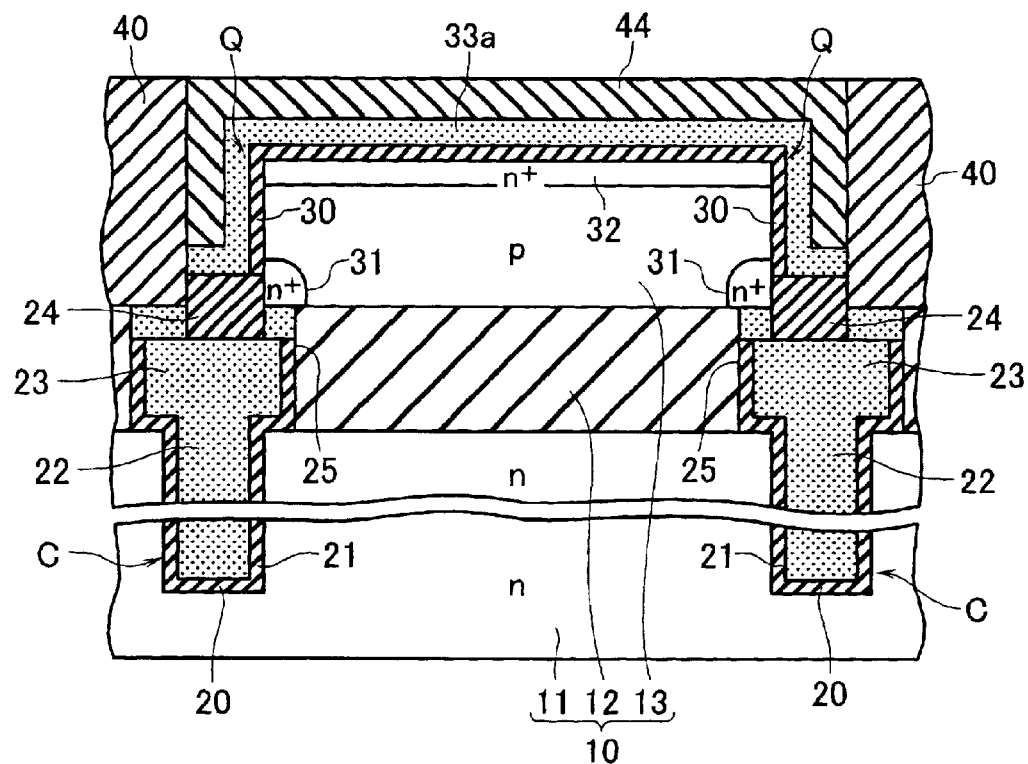

Next, as shown in FIG. 23, element isolation process is done by STI methods. More specifically, fabricate a patterned mask formed of a silicon nitride film 44. Then, RIE-etch the polysilicon film 33a and gate insulation film 30 along with the cap insulation film 24 and p-type silicon layer 13 to form element isolation grooves required. Thereafter, bury an element isolation dielectric film 40, which is typically made of silicon oxide or other similar suitable materials. Preferably the element isolation dielectric film 40 is planarized by CMP techniques. In this embodiment the element isolation grooves are formed so that each is deep enough to reach the underlying silicon oxide film 12, thereby defining electrically insulated island-shaped element regions 14 including p-type silicon layers 13, respectively. The p-type silicon layers 13 of such element regions 14, each of which makes up two DRAM cells, are electrically separated and isolated from each other.

Figure 24:
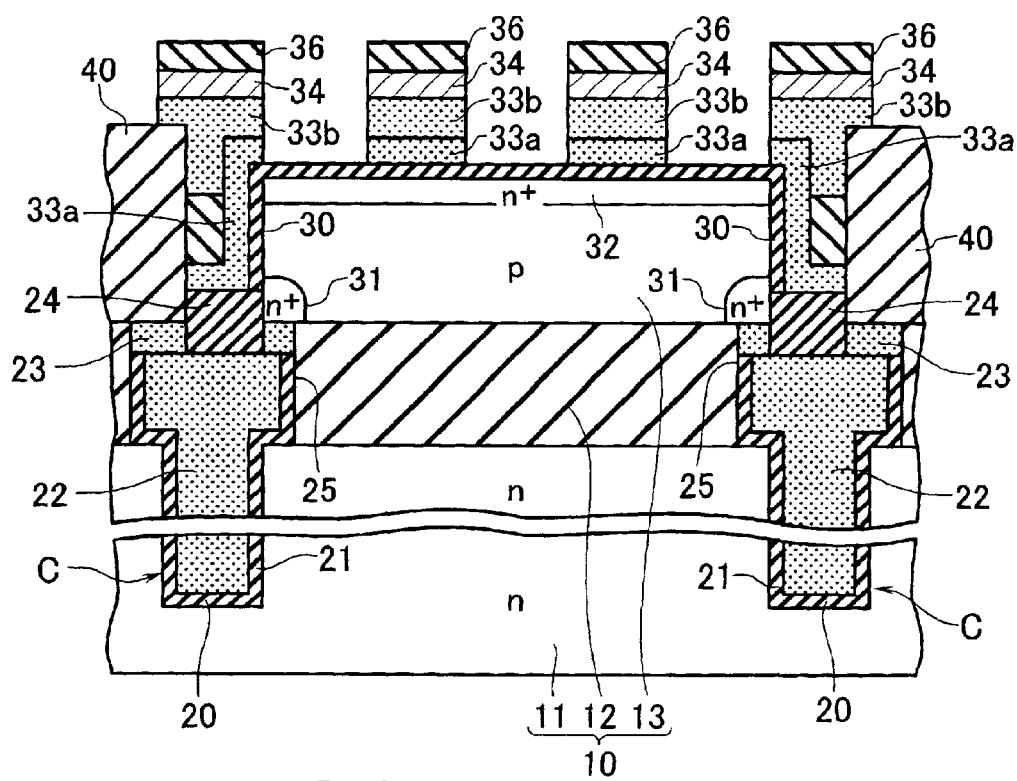

Thereafter, etch away those portions of the silicon nitride film 44 which do not reside within grooves 20. Then, as shown in FIG. 24, deposit a multilayer of polysilicon film 33b and $WSi_2$ film 34 plus silicon nitride film 36, which is then patterned to form word lines WL.

And, as shown in FIG. 18, form a silicon nitride film on sidewalls of the word lines WL; thereafter, deposit an ILD film 37. Define in this ILD film 37 contact holes, each of which is self-aligned to its corresponding word line WL. Then, form an $n^+$-type diffusion layer 35 through ion implantation. And, after having buried a contact plug 39 in each contact hole, fabricate bit lines 38, although only one of them is visible in FIG. 18.

In this way, the use of a specific scheme for doing etch treatment to let the silicon oxide film 12 recede immediately after having formed the grooves 20 for capacitor use may guarantee that electrical connection between storage electrode 22 and its associated buried trap 23 will no longer be precluded by the capacitor insulation film 21. Consequently no strict process controllabilities are required for capacitor insulation film etching conditions and buried strap etchback conditions. Higher production yields are thus obtainable.

[Embodiment 4]

Figure 25:
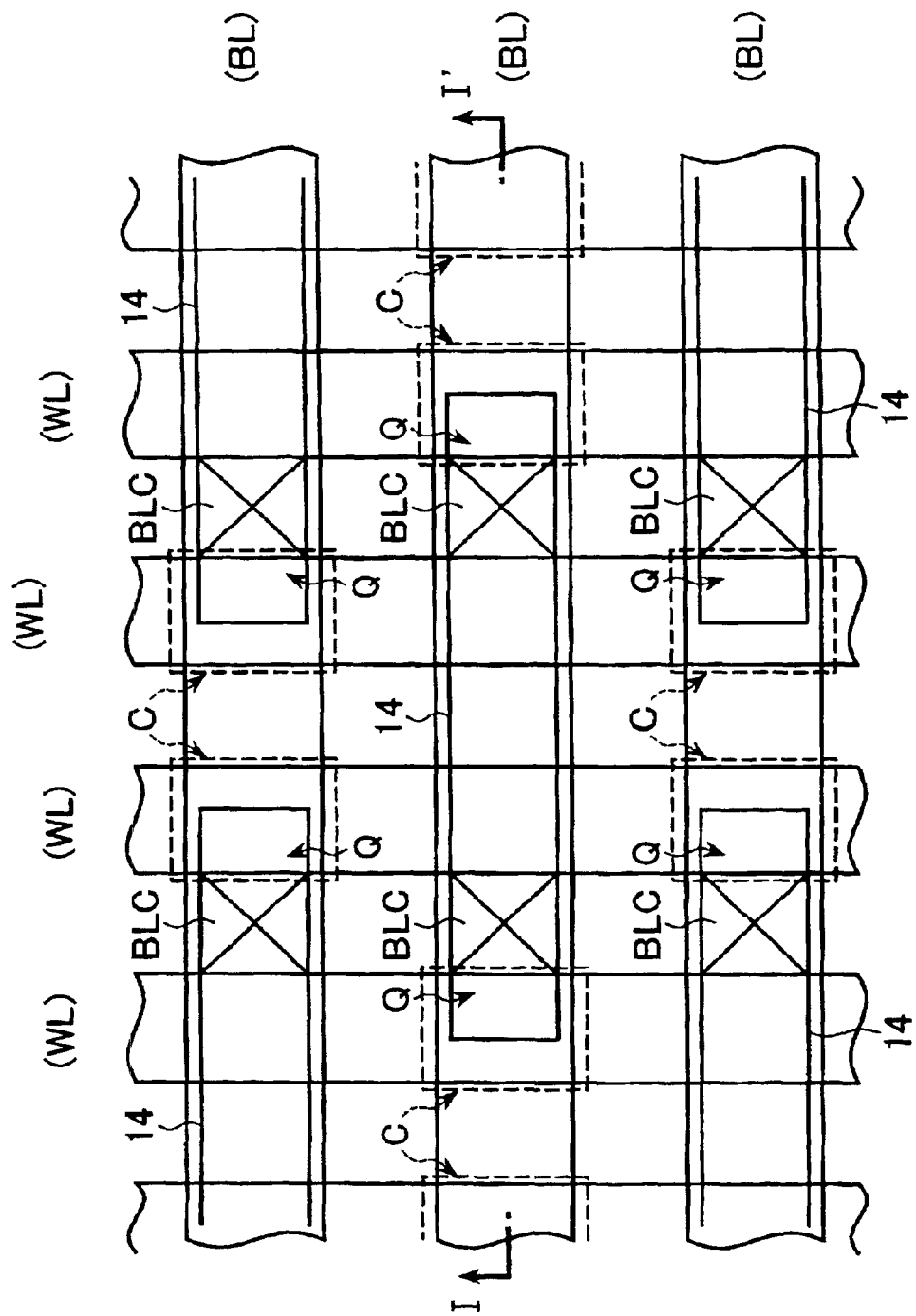
FIG. 25 shows a plan view of a DRAM cell array also embodying the invention, corresponding to that of FIG. 1.
Figure 26:
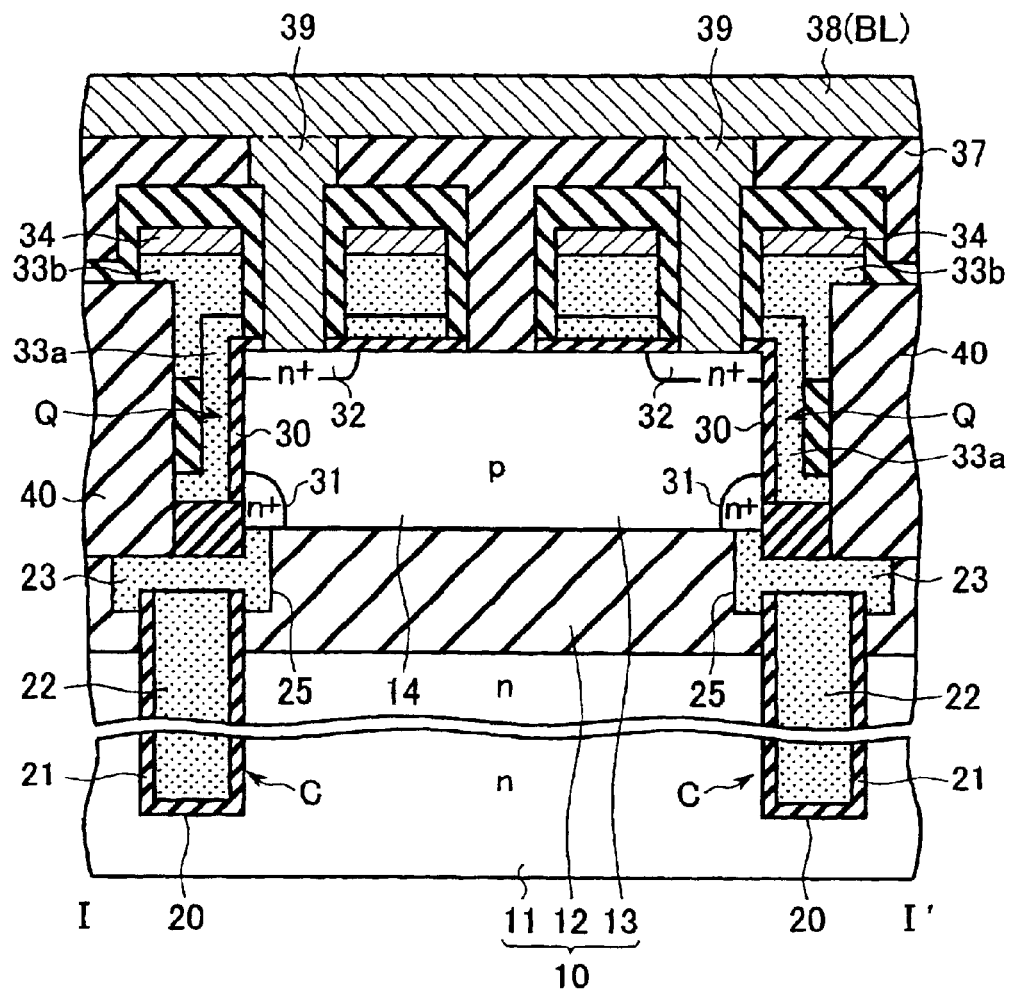
FIG. 26 is a sectional view of the structure shown in FIG. 25 as taken long line I–I'.

A trench DRAM cell array in accordance a further embodiment of the invention is shown in FIGS. 25–26, which illustrate its plan view and sectional view taken along line I–I' in a way corresponding to FIGS. 1–2 of Embodiment 1, respectively. A difference of it from Embodiment 1 lies in layout of bit-line contacts BLS. In the case of Embodiment 1, DRAM cells each being formed of capacitor C and transistor Q are formed at the opposite terminate ends of a single island-like element region 14 with a layout that permits two "pass" word lines to run therebetween, wherein a common bitline contact BLS for common use with such two cells is disposed at a portion midway between two pass word lines, i.e. at a central portion of the island-like element region 14.

In contrast, the planar layout of Embodiment 4 is such that in a similar cell layout, separate bitline contacts BLC for two cells at the opposite ends of a single island-like element region 14 are laid out at positions each neighboring upon the word line of its corresponding one of the cells.

Accordingly, the individual one of $n^+$-type transistor diffusion layers 32 is no longer required to cover the entire surface area of island-like element region 14. Thus the diffusion layers 32 required are formed only at the positions of bitline contacts BLC.

Although this embodiment is faced with a risk of increase in bitline parasitic capacitances with an increase in number of bitline contacts required, it becomes possible to lessen electrical resistivity at part spanning from a bit line to capacitor, resulting in successful reduction of a lead-wire delay time as determined by the product of a capacitance and resistance. This in turn makes it possible to increase or maximize data read/write rates.

[Embodiment 5]

While the embodiments stated supra are all designed to employ the so-called "folded" bit-line structure, this invention is also applicable to trench DRAM cell arrays of the type using "open" bitline schemes. See FIG. 27. This diagram is a plan view of main part of a DRAM cell array of the open bitline type also embodying the invention. See FIG. 28, which shows its sectional view taken along line I–I'. This cell array is similar to the above-stated Embodiment 1 in principal features, including the relation of capacitor C to transistor Q, and formation of the lower $n^+$-type diffusion layer 31 of transistor Q exclusively due to upward impurity diffusion by the buried trap 23. Hence, the same reference characters are used to designate the parts or components corresponding to those of Embodiment 1, and any detailed "repetitive" description is eliminated herein.

Figure 27:
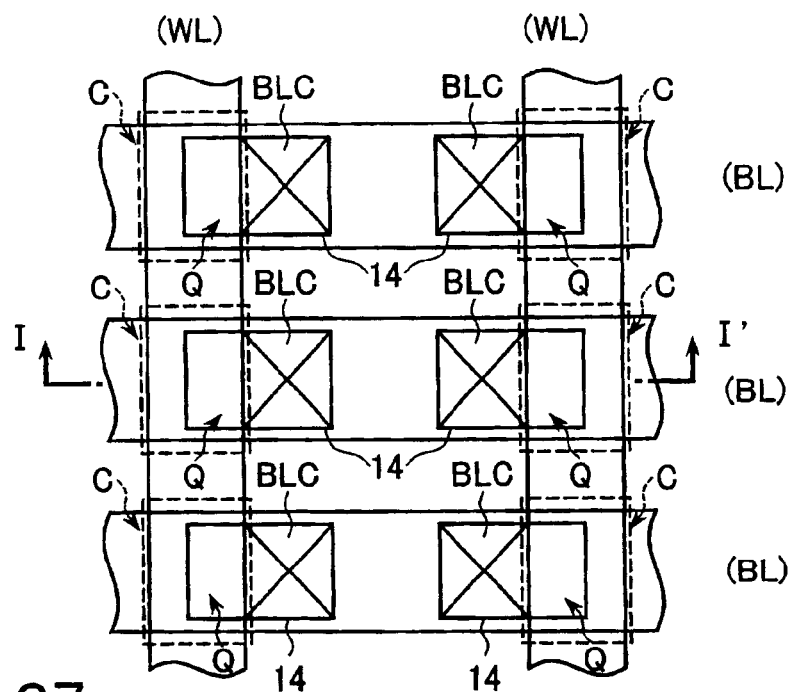
FIG. 27 is a plan view of a DRAM cell array also embodying the invention, corresponding to that of FIG. 1.
Figure 28:
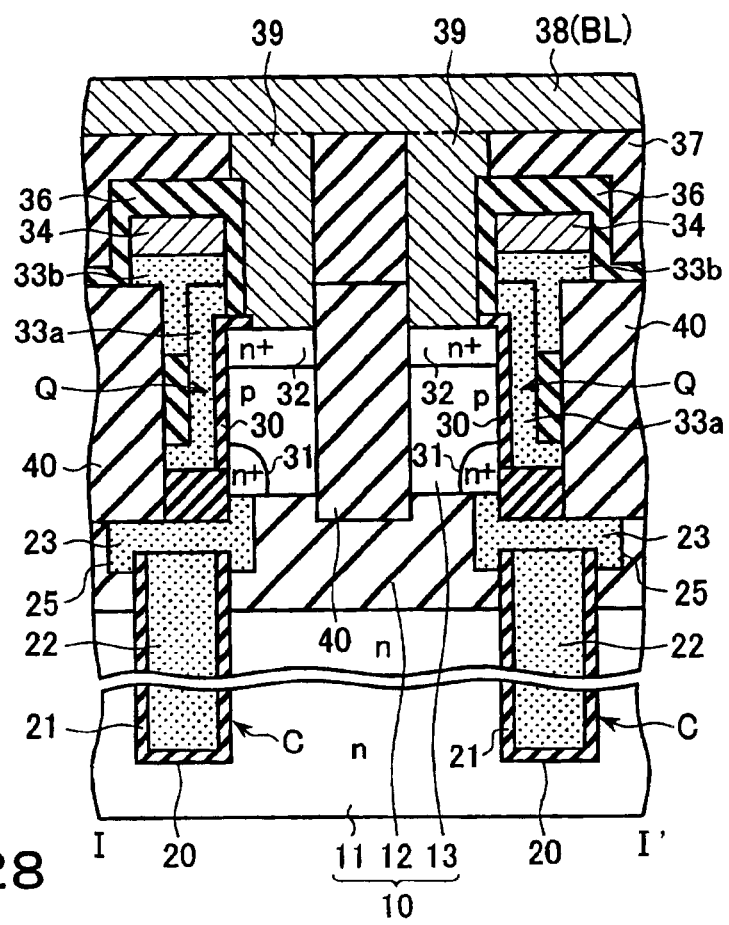
FIG. 28 is a sectional view of the structure of FIG. 27 as taken long line I–I'.

As shown in FIG. 27, in the case of the open bitline scheme, an island-like element region 14 is formed on a per-cell basis in the absence of any pass word lines, wherein the distance or layout pitch of neighboring cells in a bitline direction may be scaled down to the minimum feature size, or more or less, while letting an element isolation dielectric film 40 interposed therebetween.

[Embodiment 6]

Figure 29:
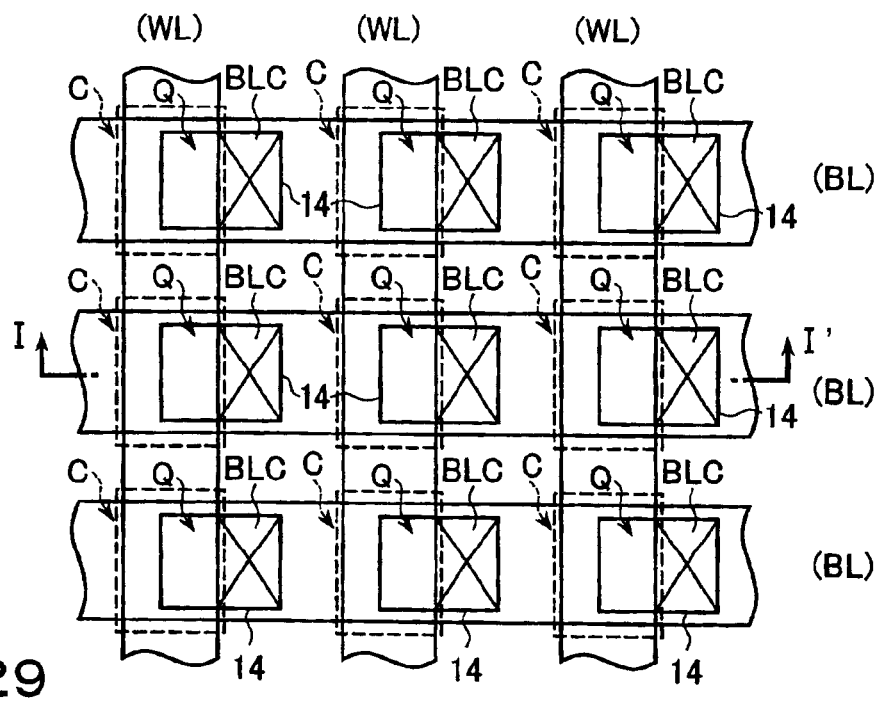
FIG. 29 is a plan view of a DRAM cell array also embodying the invention, corresponding to that of FIG. 1.
Figure 30:
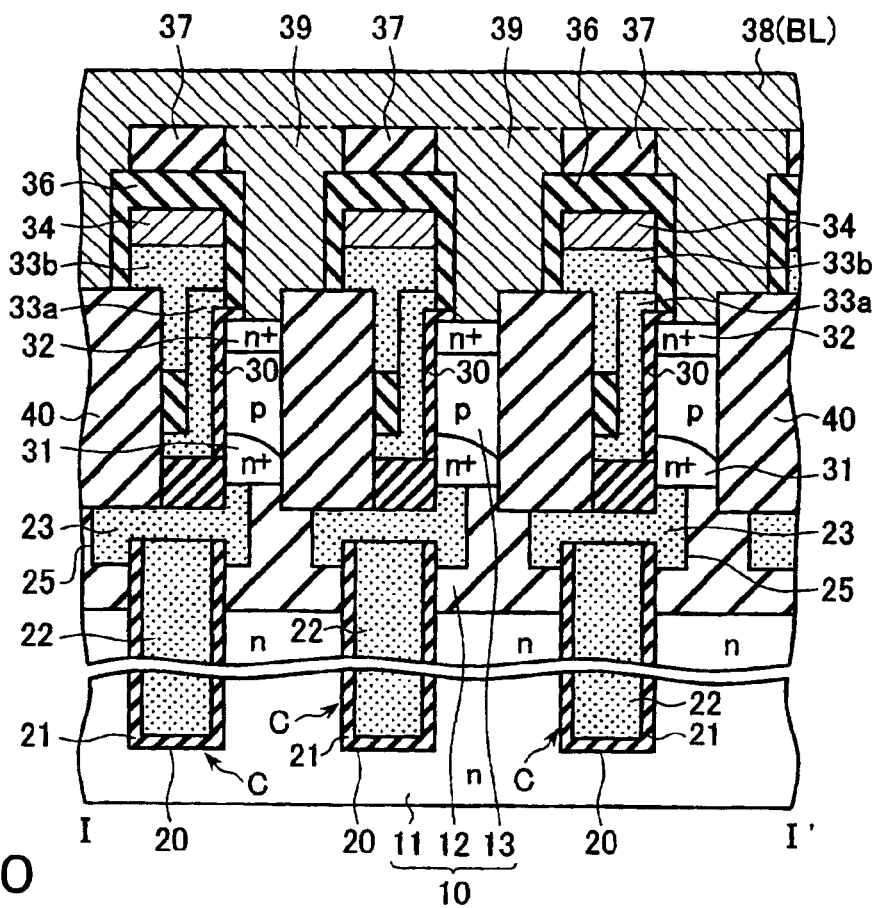
FIG. 30 is a sectional view of the structure of FIG. 29 as taken long line I–I'.

A trench DRAM cell array in accordance with another further embodiment of the invention is shown in FIGS. 29–30, wherein FIG. 29 depicts its plan view whereas FIG. 30 is a sectional view taken along line I–I'. A difference of it from Embodiment 5 is that all the cells involved are the same in direction along bit lines BL. With such cell alignment feature, the resultant cell array is made simpler in repeated pattern, thus improving lithography process margins. Consequently, as better shown in FIG. 30, the lower $n^+$-type diffusion layer 32 may also be scaled down or miniaturized to the extent that it reaches the element isolation dielectric film 40. This makes it possible to reduce the capacitance of such diffusion layer while at the same time suppressing or avoiding risks of junction leakage.

[Embodiment 7]

With all embodiments above, the substrate voltage potential of vertical transistor Q is not taken into careful consideration. The p-type silicon layer 13 of each island-like element region 14 is electrically insulated and isolated from the remaining regions by the at-the-bottom silicon oxide 12 and element isolation dielectric film 40 and thus will possibly fall into an electrically floating state—that is, become potentially unstable and uncontrollably variable in potential—if no remedies are employed additionally.

Figure 31:
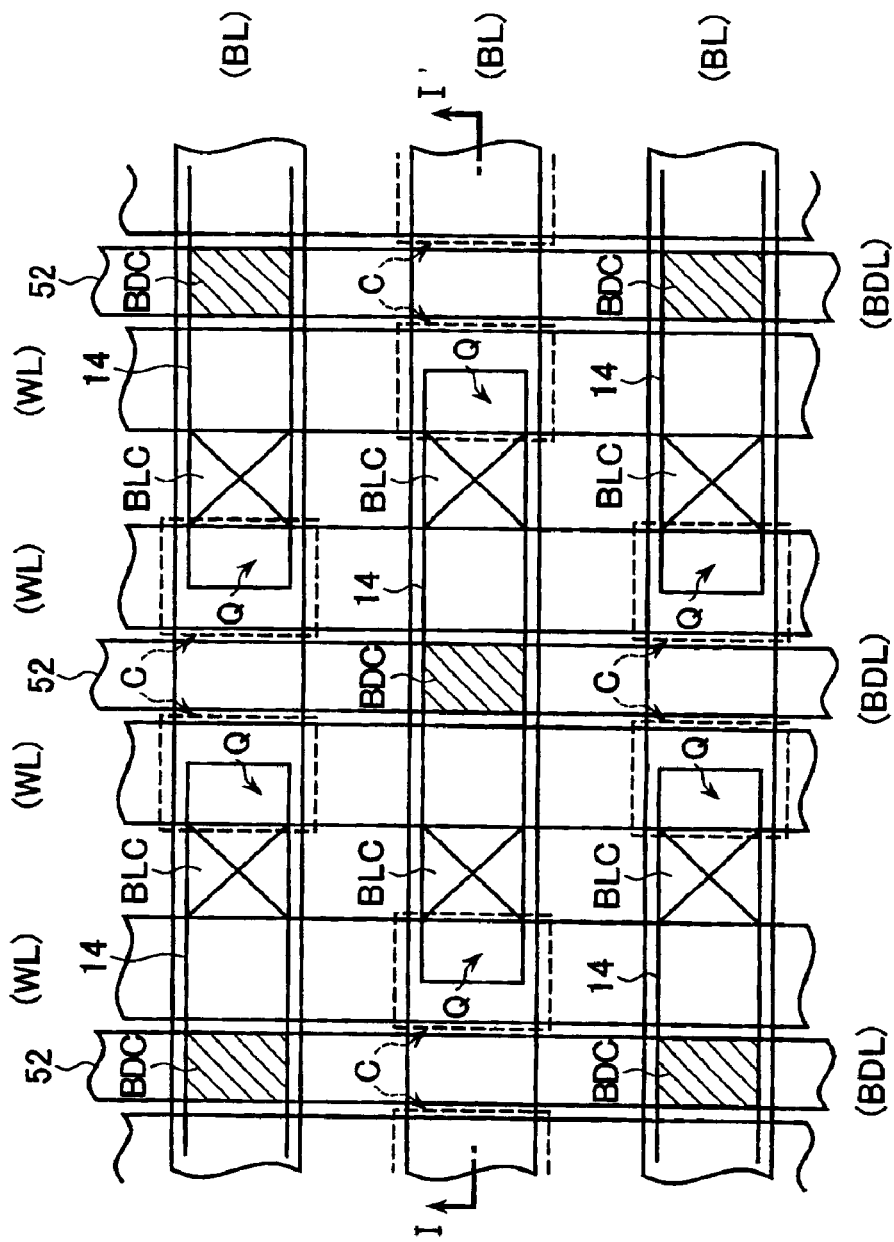
FIG. 31 is a plan view of a DRAM cell array also embodying the invention, corresponding to that of FIG. 1.
Figure 32:
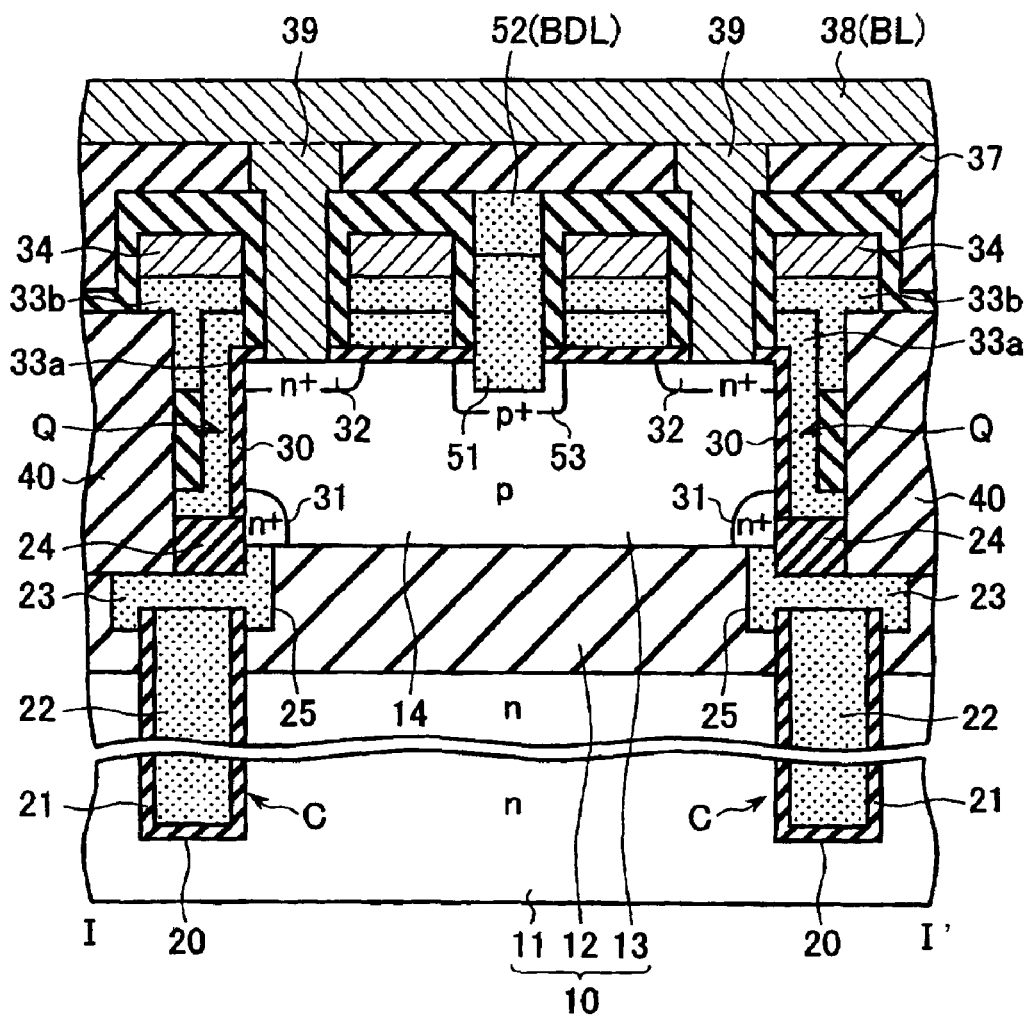
FIG. 32 is a sectional view of the structure of FIG. 31 as taken long line I–I'.

A trench DRAM cell array capable of fixation of the substrate potential in accordance with a still another embodiment of the invention is shown in FIGS. 31–32. FIG. 31 shows a plan view of the cell array. FIG. 32 is a sectional view taken along line I–I' of FIG. 31.

The DRAM cell array structure as shown herein is based on those of FIGS. 25–26, wherein a bitline contact BLC is laid out at a location in close proximity to each cell. And, a body contact BDC for potential fixation of p-type silicon layer 13 is disposed at a central portion of each island-like element region 14. In other words the body contact BDC is placed on the space between two pass word lines. And a body wiring lead (BDL) 52 for coupling together respective body contacts BDC is railed between pass word lines.

A practical fabrication process is as follows. Prior to the step of forming bitline contacts BLC, define contact holes in regions of body contacts BDC, each of which regions is between adjacent two pass word lines. Then, embed or bury a contact layer 51 therein. Preferably, as shown in FIG. 32, apply so-called "recess etching" treatment to the bottom of each contact, and then form a $p^+$-type layer 53. Thereafter, bury therein the contact layer 51 made of polysilicon material that is p-type impurity doped. Further, form body leads 52 for coupling together contact layers 51 in the word-line direction. These body leads 52 are each buried between pass word lines. Body leads 52 are made of low-resistivity lead-wire material. Examples of this material are p-type impurity-doped polysilicon and tungsten (W) or other similar suitable materials equivalent thereto.

In this way, embed-forming the body leads 52 for application of the required substrate potential to the p-type silicon layer 13 makes it possible to permit transistors to offer well stabilized operations and enhanced performances. While in FIG. 32 the contact holes are recess-etched for burying contact layers 51 therein, this scheme is effective for reduction of current leakage otherwise occurring between two neighboring cells with two pass word lines laid therebetween.

[Embodiment 8]

Figure 33:
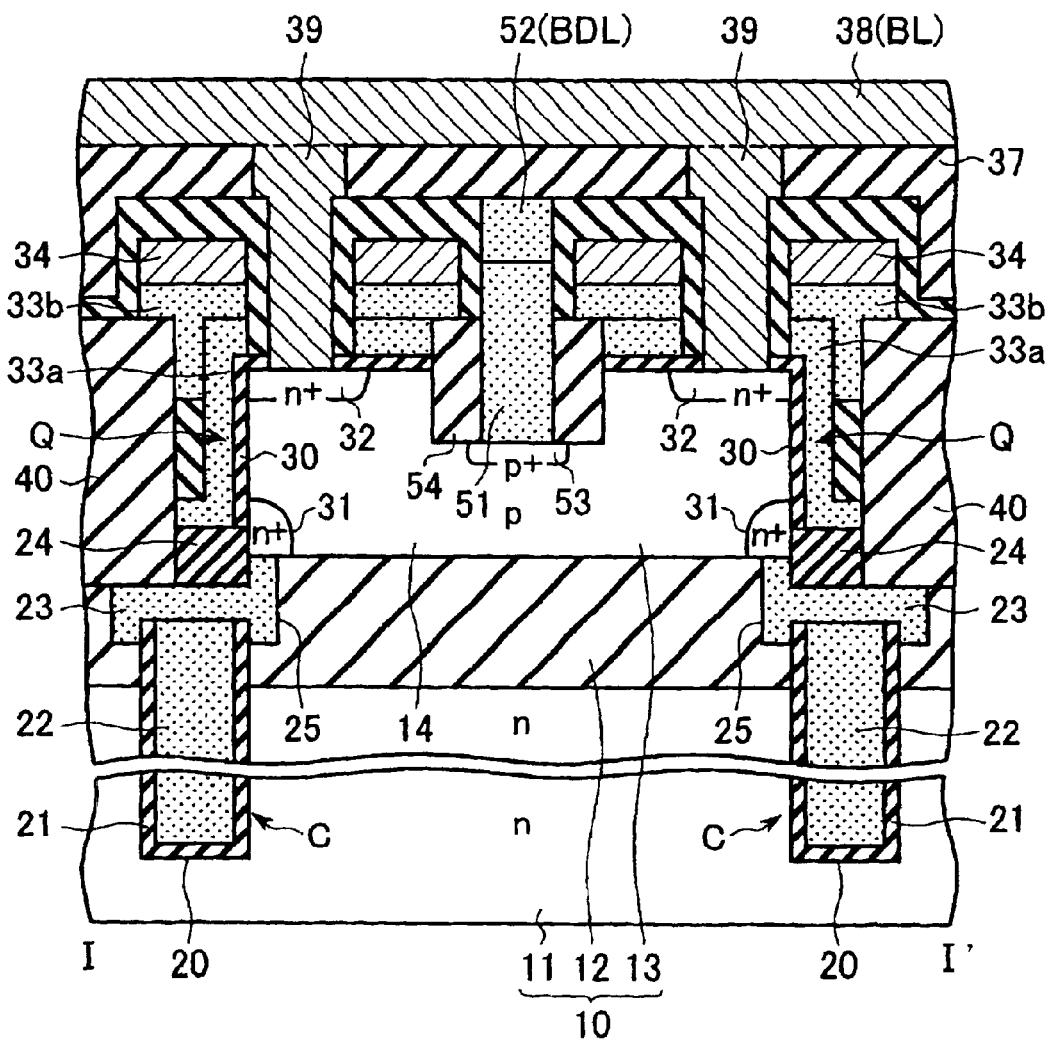
FIGS. 33 and 34 are diagrams each showing a sectional structure of a DRAM cell array in accordance with a further embodiment of the invention in a way corresponding to that of FIG. 32.

A slightly modified form of the sectional structure of the FIG. 32 embodiment is shown in FIG. 33. The trench-capacitor-sidewall vertical-transistor DRAM cell structure as shown herein is arranged so that an isolating dielectric film 54 shallower than the element isolation dielectric film 40 is buried around the contact layer 51 of body contact BDC. This structure is manufacturable by a process similar to the fabrication process of Embodiment 1 except that the step of element isolation groove etching by STI methods is immediately followed by the steps of performing etching for formation of a shallow groove in which the isolating dielectric film 54 will later be buried, and then burying the isolating dielectric film 54 along with element isolation dielectric film 40 simultaneously. Alternatively, deep STI and shallow STI grooves may be fabricated separately.

With such a body contact structure, it is possible to fix and stabilize the transistor's substrate potential, which in turn makes it possible to effectively suppress any contact leakage at body contact BDC portions otherwise occurring due to unwanted creation of channels and/or depletion layers at part underlying the pass word lines. In addition, this embodiment is more preferable than Embodiment 7 in achievement of enhanced suppressibility of current between two neighboring cells with two pass word lines interposed therebetween. Additionally, as in the case of FIG. 2, the $n^+$-type diffusion layer 32 may be formed to cover the entire area of island-like element region 14, because the $p^+$-type diffusion layer 53 is formed sufficiently deep from the top surface of the silicon layer 13, thereby surely being separated from the $n^+$-type diffusion layer 32 even if the diffusion layer 32 is formed to cover the entire area of the element region 14.

[Embodiment 9]

Figure 34:
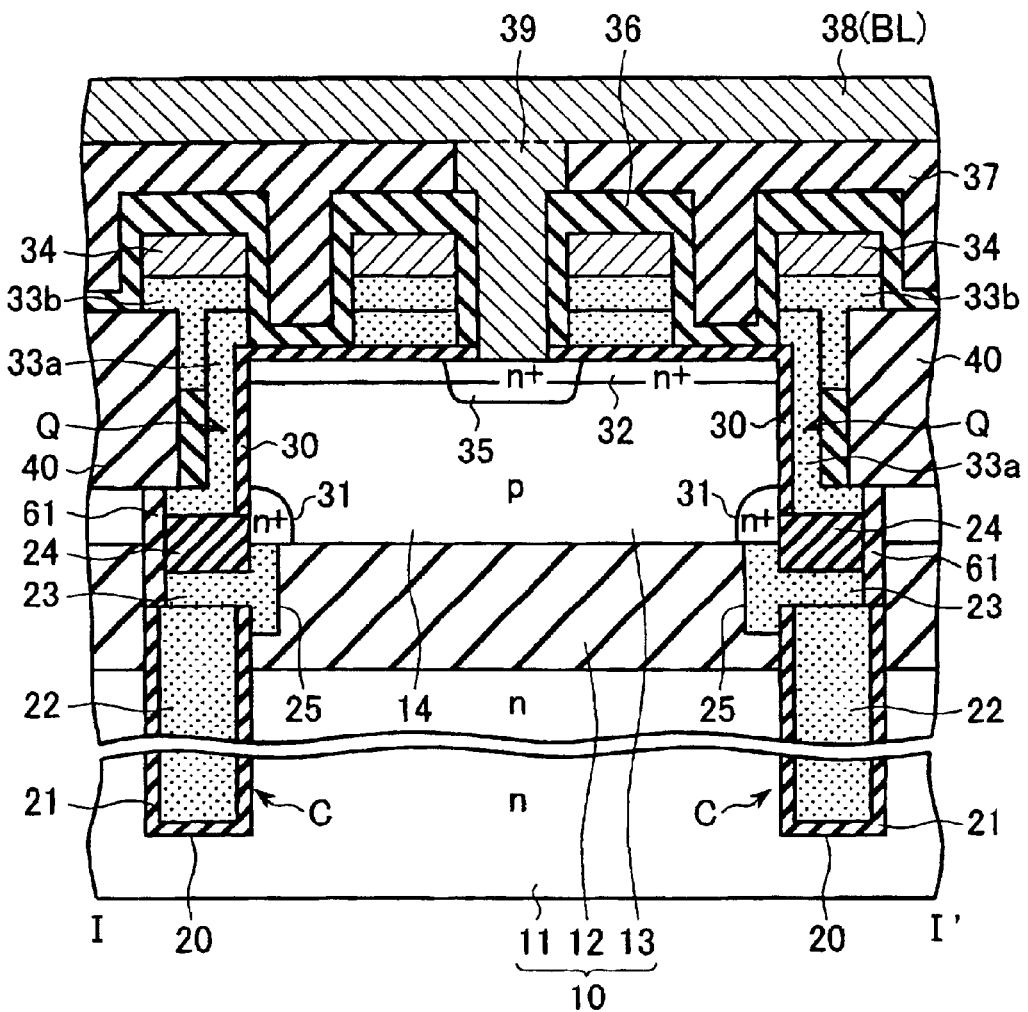

Yet another further embodiment is shown in FIG. 34, which is capable of fixing for stabilization the transistor substrate potential at the periphery of the cell array region without disposing any body contact leads. This is principally based on the structure of Embodiment 1 shown in FIG. 2. A difference from the structure of FIG. 2 is that the STI-formed element isolation dielectric film 40 is carefully designed so that its depth is less than the thickness of p-type silicon layer 13, thus preventing it from reaching the underlying silicon oxide film 12. With such an arrangement, respective island-like element regions 14 fail to be completely insulated and isolated from each other and are thus set in the state that they are mutually coupled together at the bottom of p-type silicon layer 13.

Regrettably in this case, there is a risk that current leakage can increase. This leakage would take place upon accidental occurrence of electrical short-circuiting between adjacent cells in the bitline direction in cases where the $n^+$-type diffusion layer 31 as formed through upward impurity diffusion from the buried trap 23 to p-type silicon layer 13 is fabricated to span the overall circumference of groove 20, although the leakage can also take place even in the absence of such shortcircuiting. To avoid the risk, a sidewall dielectric film 61 is formed, prior to burying of the buried trap 23, in the groove 20 at such portions—that is, on three side faces excluding one side required for formation of $n^+$-type diffusion layer 31.

Figure 35:
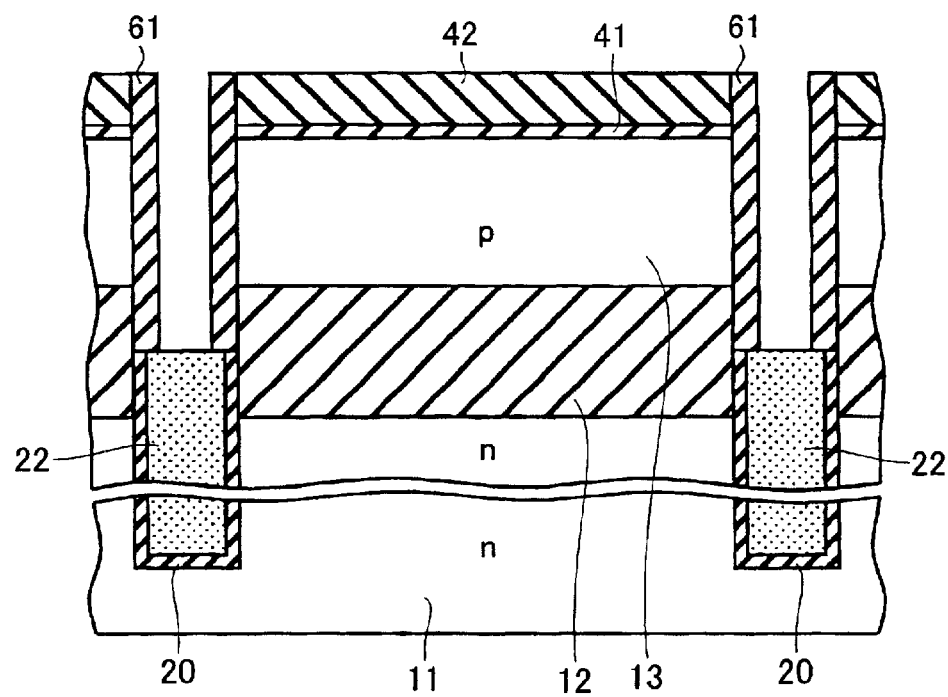
FIG. 35 shows, in cross-section, one major step in the manufacture of the DRAM cell array structure shown in FIG. 34.
Figure 36A:
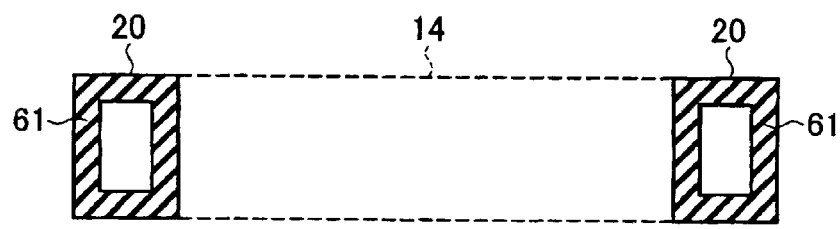
FIGS. 36A–36B are plan views for explanation of a fabrication process of the same structure.
Figure 36B:
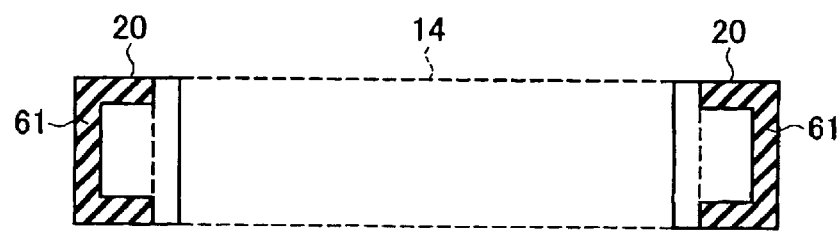

Practically, as shown in FIG. 35, after having buried the storage electrode 22 of a capacitor C, form the sidewall dielectric film 61 on an upper sidewall of groove 20. This dielectric film 61 is greater in thickness than capacitor insulation film 21 and is formed of a silicon oxide film or else. A plan view of the resultant structure is shown in FIG. 36A. Thereafter, as shown in FIG. 36B, selectively etch away only a one-side portion of the sidewall dielectric film 61 which will be later subject to impurity diffusion from its associative buried trap, causing it reside only at the remaining, three side face portions. Thereafter, a similar process to that of Embodiment 1 is used to form the buried trap 23.

An advantage of this embodiment lies in an ability to successfully fix and stabilize the substrate potential at the periphery of the cell array without having to form the body contact leads stated previously.

This invention should not be limited only to the illustrative embodiments stated supra. More specifically, although the above embodiments are all drawn to DRAM cell arrays, the invention may also be applied to a variety of types of ultralarge scale integrated circuit (ULSI) devices other than the DRAMs, including but not limited to semiconductor memories and logic ICs in light of the fact that the highly integrated vertical transistor structure and its fabrication methodology incorporating the principles of the invention offer unique features as to excellent channel length controllabilities.

As apparent from the foregoing description, a principal feature of this invention is that the source and drain of a vertical transistor formed on sidewall of a groove in an SOI substrate are fabricated by both impurity outdiffusion to the bottom surface of a semiconductor layer and impurity diffusion to the top surface thereof. This enables the resultant channel length to be determined by both the thickness of semiconductor layer and the impurity diffusion depths at the upper and lower surfaces. Thus a vertical transistor free from characteristic deviation is obtainable.

What is claimed is:

1. A semiconductor device comprising:
   an element substrate including a semiconductor layer of a first conductivity type being formed over a semiconductor substrate with a dielectric film interposed therebetween and such that said dielectric film is in contact with said semiconductor substrate;
   said element substrate having a groove formed therein with a depth extending from a top surface of said semiconductor layer into said dielectric film, said groove in said dielectric film being receded laterally so as to expose a portion of a bottom surface of said semiconductor layer and such that the width of said groove in said dielectric film is greater than that of said groove in said semiconductor layer;
   an impurity diffusion source buried in said laterally receded portion of said groove to be contacted with said portion of the bottom surface of said semiconductor layer;
   a transistor having a first diffusion layer of a second conductivity type being formed through impurity diffusion from said impurity diffusion source to said bottom surface of said semiconductor layer, a second diffusion layer of the second conductivity type formed through impurity diffusion to said top surface of said semiconductor layer, and a gate electrode formed at a side face of said groove over said impurity diffusion source with a gate insulation film between said side face and said gate electrode; and
   a trench capacitor formed under said dielectric film to have a storage electrode as half buried in said groove, for constitution of a DRAM cell together with said transistor,
   wherein said groove is formed deep enough to reach the inside of said semiconductor substrate after penetration through said dielectric film,
   wherein a buried strap for use as said impurity diffusion source is formed and buried in said laterally receded portion overlying said storage electrode to be contacted with said semiconductor layer only at the bottom surface thereof,
   wherein said buried strap is covered with a cap insulation film with the gate electrode of said transistor embedded to overlie said cap insulation film, and
   wherein said buried strap comprises a first strap buried on said storage electrode and a second strap stacked on the first strap and buried in said laterally receded portion being in contact with said semiconductor layer only at the bottom surface thereof.

2. A semiconductor device comprising:
   an element substrate including a semiconductor layer of a first conductivity type being formed over a semiconductor substrate with a dielectric film interposed therebetween and such that said dielectric film is in contact with said semiconductor substrate;
   said element substrate having a groove formed therein with a depth extending from a top surface of said semiconductor layer into said dielectric film, said groove in said dielectric film being receded laterally so as to expose a portion of a bottom surface of said semiconductor layer and such that the width of said groove in said dielectric film is greater than that of said groove in said semiconductor layer;
   an impurity diffusion source buried in said laterally receded portion of said groove to be contacted with said portion of the bottom surface of said semiconductor layer;
   a transistor having a first diffusion layer of a second conductivity type being formed through impurity diffusion from said impurity diffusion source to said bottom surface of said semiconductor layer, a second diffusion layer of the second conductivity type formed through impurity diffusion to said top surface of said semiconductor layer, and a gate electrode formed at a side face of said groove over said impurity diffusion source with a gate insulation film between said side face and said gate electrode; and
   a trench capacitor formed under said dielectric film to have a storage electrode as half buried in said groove, for constitution of a DRAM cell together with said transistor,
   wherein said groove is formed deep enough to reach the inside of said semiconductor substrate after penetration through said dielectric film,
   wherein a buried strap for use as said impurity diffusion source is formed and buried in said laterally receded portion overlying said storage electrode to be contacted with said semiconductor layer only at the bottom surface thereof,
   wherein said buried strap is covered with a cap insulation film with the sate electrode of said transistor embedded to overlie said cap insulation film, and
   wherein said laterally receded portion of said groove is formed to cover an entire range of a thickness of said dielectric film whereas the storage electrode of said capacitor is half buried in said laterally receded portion with said buried strap being embedded on said storage electrode to be contacted with said semiconductor layer only at the bottom surface thereof.

3. A semiconductor device comprising:
   an element substrate including a semiconductor layer of a first conductivity type being formed over a semiconductor substrate with a dielectric film interposed therebetween and such that said dielectric film is in contact with said semiconductor substrate;

said element substrate having a groove formed therein with a depth extending from a top surface of said semiconductor layer into said dielectric film, said groove in said dielectric film being receded laterally so as to expose a portion of a bottom surface of said semiconductor layer and such that the width of said groove in said dielectric film is greater than that of said groove in said semiconductor layer;

an impurity diffusion source buried in said laterally receded portion of said groove to be contacted with said portion of the bottom surface of said semiconductor layer;

a transistor having a first diffusion layer of a second conductivity type being formed through impurity diffusion from said impurity diffusion source to said bottom surface of said semiconductor layer, a second diffusion layer of the second conductivity type formed through impurity diffusion to said to surface of said semiconductor layer, and a gate electrode formed at a side face of said groove over said impurity diffusion source with a gate insulation film between said side face and said gate electrode; and a trench capacitor formed under said dielectric film to have a storage electrode as half buried in said groove, for constitution of a DRAM cell together with said transistor, wherein said groove is formed deep enough to reach the inside of said semiconductor substrate after penetration through said dielectric film, wherein said semiconductor layer is partitioned into a plurality of element regions by an element isolating insulative film formed and buried deep enough to reach said dielectric film while letting two DRAM cells be disposed at opposite end portions of each said element region to thereby constitute a DRAM cell array with a word line connected to the gate electrode of said transistor and a bit line coupled to the second diffusion layer of said transistor said word line and said bit line being continuously disposed to cross each other, and wherein said bit line is in contact with said second diffusion layer of each DRAM cell at a position adjacent to word lines at both ends of each said element region, and wherein a body wire lead is formed to be contacted with said semiconductor layer across central part of said element region for applying a fixed potential to said semiconductor layer.

4. A semiconductor device comprising:

an element substrate including a semiconductor layer of a first conductivity type being formed over a semiconductor substrate with a dielectric film interposed therebetween and such that said dielectric film is in contact with said semiconductor substrate;

said element substrate having a groove formed therein with a depth extending from a top surface of said semiconductor layer into said dielectric film, said groove in said dielectric film being receded laterally so as to expose a portion of a bottom surface of said semiconductor layer and such that the width of said groove in said dielectric film is greater than that of said groove in said semiconductor layer;

an impurity diffusion source buried in said laterally receded portion of said groove to be contacted with said portion of the bottom surface of said semiconductor layer;

a transistor having a first diffusion layer of a second conductivity type being formed through impurity diffusion from said impurity diffusion source to said bottom surface of said semiconductor layer, a second diffusion layer of the second conductivity type formed through impurity diffusion to said top surface of said semiconductor layer, and a gate electrode formed at a side face of said groove over said impurity diffusion source with a gate insulation film between said side face and said gate electrode; and a trench capacitor formed under said dielectric film to have a storage electrode as half buried in said groove, for constitution of a DRAM cell together with said transistor, wherein said groove is formed deep enough to reach the inside of said semiconductor substrate after penetration through said dielectric film, and wherein said semiconductor layer is partitioned into a plurality of element regions by an element isolating insulative film formed and buried with a depth failing to reach said dielectric film while letting two DRAM cells be disposed at opposite end portions of each said element region to thereby constitute a DRAM cell array with a word line connected to the gate electrode of said transistor and a bit line coupled to the second diffusion layer of said transistor said word line and said bit line being continuously disposed to cross each other.

5. A semiconductor device comprising:

an element substrate including a semiconductor layer of a first conductivity type being formed over a semiconductor substrate with a dielectric film interposed therebetween and such that said dielectric film is in contact with said semiconductor substrate;

said element substrate having a groove formed therein with a depth extending from a top surface of said semiconductor layer into the inside of said semiconductor substrate after penetration through said dielectric film, said groove in said dielectric film being receded laterally so as to expose a portion of a bottom surface of said semiconductor layer and such that the width of said groove in said dielectric film is greater than that of said groove in said semiconductor layer;

a trench capacitor formed under said dielectric film to have a storage electrode as half buried in said groove;

an impurity diffusion source buried in said laterally receded portion of said groove to serve as a buried strap, bottom surface and top surface of said impurity diffusion source being contacted with said storage electrode and said portion of the bottom surface of said semiconductor layer, respectively;

a cap insulation film formed in said groove to cover said impurity diffusion source; and a transistor having a first diffusion layer of a second conductivity type being formed through impurity diffusion from said impurity diffusion source to said bottom surface of said semiconductor layer, a second diffusion layer of the second conductivity type formed through impurity diffusion to said top surface of said semiconductor layer, and a gate electrode formed at a side face of said groove over said impurity diffusion source with a gate insulation film between said side face and said gate electrode, said transistor constituting a DRAM cell with said trench capacitor, wherein said buried strap comprises a first strap buried on said storage electrode and a second strap stacked on the first strap and buried in said increased width portion being in contact with said semiconductor layer only at the bottom surface thereof.

6. A semiconductor device comprising:

an element substrate including a semiconductor layer of a first conductivity type being formed over a semiconductor substrate with a dielectric film interposed therebetween and such that said dielectric film is in contact with said semiconductor substrate;

said element substrate having a groove formed therein with a depth extending from a top surface of said semiconductor layer into the inside of said semiconductor substrate after penetration through said dielectric film, said groove in said dielectric film being receded laterally so as to expose a portion of a bottom surface of said semiconductor layer and such that the width of said groove in said dielectric film is greater than that of said groove in said semiconductor layer;

a trench capacitor formed under said dielectric film to have a storage electrode as half buried in said groove;

an impurity diffusion source buried in said laterally receded portion of said groove to serve as a buried strap, bottom surface and top surface of said impurity diffusion source being contacted with said storage electrode and said portion of the bottom surface of said semiconductor layer, respectively;

a cap insulation film formed in said groove to cover said impurity diffusion source; and a transistor having a first diffusion layer of a second conductivity type being formed through impurity diffusion from said impurity diffusion source to said bottom surface of said semiconductor layer, a second diffusion layer of the second conductivity type formed through impurity diffusion to said to surface of said semiconductor layer, and a gate electrode formed at a side face of said groove over said impurity diffusion source with a gate insulation film between said side face and said gate electrode, said transistor constituting a DRAM cell with said trench capacitor, wherein said laterally receded groove portion of said groove is formed to cover an entire range of a thickness of said dielectric film whereas the storage electrode of said capacitor as half buried in said increased width groove portion with said buried strap being embedded on said storage electrode to be contacted with said semiconductor layer only at the bottom surface thereof.

7. A semiconductor device comprising:

an element substrate including a semiconductor layer of a first conductivity type being formed over a semiconductor substrate with a dielectric film interposed therebetween and such that said dielectric film is in contact with said semiconductor substrate;

said element substrate having a groove formed therein with a depth extending from a top surface of said semiconductor layer into the inside of said semiconductor substrate after penetration through said dielectric film, said groove in said dielectric film being receded laterally so as to expose a portion of a bottom surface of said semiconductor layer and such that the width of said groove in said dielectric film is greater than that of said groove in said semiconductor layer;

a trench capacitor formed under said dielectric film to have a storage electrode as half buried in said groove;

an impurity diffusion source buried in said laterally receded portion of said groove to serve as a buried strap, bottom surface and top surface of said impurity diffusion source being contacted with said storage electrode and said portion of the bottom surface of said semiconductor layer, respectively;

a cap insulation film formed in said groove to cover said impurity diffusion source; and a transistor having a first diffusion layer of a second conductivity type being formed through impurity diffusion from said impurity diffusion source to said bottom surface of said semiconductor layer, a second diffusion layer of the second conductivity type formed through impurity diffusion to said top surface of said semiconductor layer, and a gate electrode formed at a side face of said groove over said impurity diffusion source with a gate insulation film between said side face and said gate electrode, said transistor constituting a DRAM cell with said trench capacitor, wherein said semiconductor layer is partitioned into a plurality of element regions by an element isolating insulative film as formed and buried deep enough to reach said dielectric film while letting two DRAM cells be disposed at opposite end portions of each said element region to thereby constitute a DRAM cell array with a word line connected to the gate electrode of said transistor and a bit line coupled to said second diffusion layer of said transistor, said word line and bit line being continuously disposed to cross each other, and wherein said bit line is in contact with said second diffusion layer of each DRAM cell at a position adjacent to word lines at both ends of each said element region, and wherein a body wire lead is formed to be contacted with said semiconductor layer across central part of said element region for applying a fixed potential to said semiconductor layer.

8. A semiconductor device comprising:

an element substrate including a semiconductor layer of a first conductivity type being formed over a semiconductor substrate with a dielectric film interposed therebetween and such that said dielectric film is in contact with said semiconductor substrate;

said element substrate having a groove formed therein with a depth extending from a top surface of said semiconductor layer into the inside of said semiconductor substrate after penetration through said dielectric film, said groove in said dielectric film being receded laterally so as to expose a portion of a bottom surface of said semiconductor layer and such that the width of said groove in said dielectric film is greater than that of said groove in said semiconductor layer;

a trench capacitor formed under said dielectric film to have a storage electrode as half buried in said groove;

an impurity diffusion source buried in said laterally receded portion of said groove to serve as a buried strap, bottom surface and top surface of said impurity diffusion source being contacted with said storage electrode and said portion of the bottom surface of said semiconductor layer, respectively;

a cap insulation film formed in said groove to cover said impurity diffusion source; and a transistor having a first diffusion layer of a second conductivity type being formed through impurity diffusion from said impurity diffusion source to said bottom surface of said semiconductor layer, a second diffusion layer of the second conductivity type formed through impurity diffusion to said top surface of said semiconductor layer, and a gate electrode formed at a side face of said groove over said impurity diffusion source with a gate insulation film between said side face and said gate electrode, said transistor constituting a DRAM cell with said trench capacitor, wherein said semiconductor layer is partitioned into a plurality of element regions by an element isolating insulative film as formed and buried with a depth failing to reach said dielectric film while letting two DRAM cells be disposed at opposite end portions of each said element region to thereby constitute a DRAM cell array with a word line connected to the gate electrode of said transistor and a bit line coupled to said second diffusion layer of said transistor, said word line and bit line being continuously disposed to cross each other.

9. The semiconductor device according to claim 1, wherein said element substrate is a silicon-on-insulator substrate.

* * * * *